(12) United States Patent
Park et al.

(10) Patent No.: US 10,240,739 B2
(45) Date of Patent: Mar. 26, 2019

(54) LIGHT EMITTING MODULE

(71) Applicant: LG ELECTRONICS INC., Seoul (KR)

(72) Inventors: Jun Park, Seoul (KR); Byungwoo Jeoung, Seoul (KR); Sangok Yeo, Seoul (KR)

(73) Assignee: LG Electronics Inc., Seoul (KR)

( * ) Notice: Subject to any disclaimer, the term of this patent is extended or adjusted under 35 U.S.C. 154(b) by 233 days.

(21) Appl. No.: 15/136,106

(22) Filed: Apr. 22, 2016

(65) Prior Publication Data

US 2016/0369965 A1 Dec. 22, 2016

(30) Foreign Application Priority Data

Apr. 23, 2015 (KR) .................. 10-2015-0057463

(51) Int. Cl.
*F21V 9/00* (2018.01)
*F21S 41/14* (2018.01)
(Continued)

(52) U.S. Cl.
CPC ............. *F21S 41/14* (2018.01); *F21S 41/135* (2018.01); *F21S 41/143* (2018.01); *F21S 41/16* (2018.01); *F21S 41/17* (2018.01); *F21S 41/19* (2018.01); *F21S 41/255* (2018.01); *F21S 41/285* (2018.01); *F21S 41/295* (2018.01); *F21S 41/321* (2018.01); *F21S 41/36* (2018.01); *F21S 41/395* (2018.01); *F21V 5/04* (2013.01);
(Continued)

(58) Field of Classification Search
CPC ...... F21S 41/36; F21S 41/365; F21S 48/1104; F21S 48/1109; F21S 48/1159; F21S 48/1241; F21S 48/13; F21S 48/1305; F21S 48/1329; F21S 48/1388; F21S 48/155; F21S 48/1757; F21S 48/2268; F21S 48/23
USPC .......................................................... 362/84
See application file for complete search history.

(56) References Cited

U.S. PATENT DOCUMENTS

2011/0148280 A1    6/2011  Kishimoto et al.
2012/0057363 A1*   3/2012  Ishida .................. F21S 41/143
                                                              362/516
(Continued)

FOREIGN PATENT DOCUMENTS

CN    101858550 A    10/2010
CN    102434833 A     5/2012
(Continued)

OTHER PUBLICATIONS

Extended European Search Report issued in European Application No. 16166621.9 dated Aug. 12, 2016, 8 pages.
(Continued)

*Primary Examiner* — Anh Mai
*Assistant Examiner* — Matthew Peerce
(74) *Attorney, Agent, or Firm* — Fish & Richardson P.C.

(57) ABSTRACT

A light emitting module is disclosed. The light emitting module includes a condensing lens for condensing incident light into a space, a light source for providing first light to pass through the condensing lens, a first optical path conversion member for reflecting the first light to provide first reflected light to pass through the condensing lens and a second optical path conversion member for providing the first reflected light as second reflected light to pass through the condensing lens.

37 Claims, 28 Drawing Sheets

(51) Int. Cl.

| | | |
|---|---|---|
| *F21V 29/70* | (2015.01) | |
| *F21V 5/04* | (2006.01) | |
| *F21V 7/00* | (2006.01) | |
| *F21V 13/12* | (2006.01) | |
| *F21V 29/51* | (2015.01) | |
| *F21V 29/71* | (2015.01) | |
| *F21V 29/76* | (2015.01) | |
| *F21V 13/04* | (2006.01) | |
| *F21V 14/04* | (2006.01) | |
| *H01S 5/323* | (2006.01) | |
| *F21S 41/19* | (2018.01) | |
| *F21S 41/143* | (2018.01) | |
| *F21S 41/17* | (2018.01) | |
| *F21S 41/29* | (2018.01) | |
| *F21S 41/20* | (2018.01) | |
| *F21S 41/255* | (2018.01) | |
| *F21S 41/39* | (2018.01) | |
| *F21S 41/32* | (2018.01) | |
| *F21S 41/36* | (2018.01) | |
| *F21S 41/16* | (2018.01) | |
| *F21V 9/30* | (2018.01) | |
| *F21S 41/135* | (2018.01) | |
| *F21Y 115/30* | (2016.01) | |
| *F21Y 115/10* | (2016.01) | |
| *F21S 45/47* | (2018.01) | |
| *F21S 41/365* | (2018.01) | |

(52) U.S. Cl.
CPC .......... *F21V 7/0033* (2013.01); *F21V 7/0041* (2013.01); *F21V 9/30* (2018.02); *F21V 13/04* (2013.01); *F21V 13/12* (2013.01); *F21V 14/04* (2013.01); *F21V 29/51* (2015.01); *F21V 29/70* (2015.01); *F21V 29/713* (2015.01); *F21V 29/76* (2015.01); *H01S 5/32316* (2013.01); *F21S 41/365* (2018.01); *F21S 45/47* (2018.01); *F21Y 2115/10* (2016.08); *F21Y 2115/30* (2016.08)

(56) References Cited

U.S. PATENT DOCUMENTS

| | | | | |
|---|---|---|---|---|
| 2013/0215634 | A1* | 8/2013 | Tseng | F21S 41/147 362/516 |
| 2013/0322105 | A1* | 12/2013 | Uchida | B60Q 1/16 362/517 |
| 2015/0043233 | A1* | 2/2015 | Bauer | B60Q 11/00 362/510 |
| 2016/0146417 | A1* | 5/2016 | Ohsawa | F21S 48/1258 362/521 |

FOREIGN PATENT DOCUMENTS

| | | | |
|---|---|---|---|
| CN | 102720954 | | 10/2012 |
| CN | 103375748 A | | 10/2013 |
| CN | 104159786 A | | 11/2014 |
| DE | 102012211915 | | 1/2014 |
| JP | 2006-113085 | | 4/2006 |
| JP | 2007-072339 | | 3/2007 |
| JP | 2011-142000 | | 7/2011 |
| JP | 2013-016400 | | 1/2013 |
| JP | 2014-178464 | | 9/2014 |
| JP | 2014-240270 | | 12/2014 |
| WO | 2013/134807 | | 9/2013 |
| WO | WO 2014009289 A1 * | 1/2014 | .......... F21S 48/1145 |

OTHER PUBLICATIONS

Ma, S. Q., "Dictionary of Modern Motion Picture and Video Technology," 1998 (with partial English Translation).
Chinese Office Action in Chinese Application No. 201610258498.0, dated Mar. 26, 2018, 14 pages.

* cited by examiner

LIGHT EMITTING MODULE

CLAIM OF PRIORITY

This application claims the benefit of priority to Korean Applicant No. 10-2015-0057463 filed Apr. 23, 2015, the entire contents of which are hereby incorporated by reference.

BACKGROUND OF THE INVENTION

1. Field of the Invention

The present invention relates to a light emitting module, a lamp device for vehicles including the light emitting module, and a vehicle including the lamp device.

2. Description of the Related Art

In general, vehicles are equipped with lamp devices for illuminating nearby objects during poor lighting conditions or signaling the state of driving to nearby vehicles or pedestrians.

The lamp device for vehicles includes a head lamp mounted to the front side of the vehicle and a tail lamp mounted to the rear side of the vehicle. The head lamp is a lamp for illuminating the area ahead while driving at night. The tail lamp includes a brake lamp, which is turned on when a driver steps on a brake, and a turn signal lamp, which indicates the direction of travel of the vehicle.

Recently, light emitting diodes or laser diodes have been used as light sources for automotive lamp devices for good energy efficiency.

In particular, laser diodes are receiving attention due to their high degree of straightness, long-distance illumination and non-disturbance of the field of vision of drivers of oncoming vehicles.

The laser diode needs a phosphor and a lens assembly in order to output white light. However, this complicates the structure of the automotive lamp device, reduces efficiency, and increases the volume of the device. The lamp device for vehicles having a conventional laser diode will now be described.

FIG. 20 is a conceptual view of a conventional light emitting module. Referring to FIG. 20, a conventional light emitting module operates in such a manner that blue light generated from a laser diode is focused while passing through a prism 3 and a lens 4, the focused light is reflected from a first optical path conversion member 5, passes through a light transmissive phosphor 6 and is converted into white light, and the white light is radiated forward from a second optical path conversion member 7.

However, if the light emitting module is arranged lengthwise along an optical axis inside the head lamp for vehicles, the length of the head lamp may be increased.

Further, since the conventional light emitting module needs a relatively large number of components and has an optical path structure in which the light passes through each component only once, it may be hard to manufacture a compact head lamp due to the overall size of the components.

Specifically, light transmitted through the light transmissive phosphor 6 spreads out in a fan shape. For this reason, it is necessary for light incident upon the light transmissive phosphor 6 to be concentrated on a small spot (about 0.5 mm). The conventional light emitting module uses the above-described optical path in order to focus light (having a diameter of about 6 mm) emitted from the laser diode on a small spot on the light transmissive phosphor 6.

In addition, using a large number of components in order to focus light on such a small spot may increase costs and deteriorate reliability, and using the light transmissive phosphor may cause a decrease in efficiency.

The light transmissive phosphor must be configured such that light is transmitted through the front surface and the rear surface of the light transmissive phosphor, which have a large area than the side surface of the light transmissive phosphor, and heat is dissipated through the side surface of the light transmissive phosphor, through which light is not transmitted. As a result, a heat sink must be connected to the side surface of the light transmissive phosphor.

In this case, the contact area between the light transmissive phosphor and the heat sink is small with the result that heat is not easily dissipated from the light transmissive phosphor, whereby the light transmissive phosphor easily overheats. In general, the efficiency of the light transmissive phosphor is abruptly reduced at high temperature with the result that lighting using the light transmissive phosphor has limited intensity of light.

SUMMARY OF THE INVENTION

Therefore, the present invention has been made in view of the above problems, and it is an object of the present invention to reduce the size of a light emitting module and to reduce the number of components constituting the light emitting module using a single lens for many purposes.

It is another object of the present invention to provide a light emitting module which has improved light straightness of a laser diode and which exhibits high light efficiency and luminance.

It is a further object of the present invention to provide a light emitting module configured such that thermal concentration is maximally prevented during conversion of the wavelength of light incident from a light source including a laser diode, thereby improving efficiency in wavelength conversion.

In accordance with an aspect of the present invention, the above and other objects can be accomplished by the provision of a light emitting module including a condensing lens for condensing incident light into a space, a light source disposed behind the condensing lens to emit first light toward the condensing lens, a first optical path conversion member disposed in front of the condensing lens to reflect the first light having passed through the condensing lens and to supply first reflected light to the condensing lens, and a second optical path conversion member disposed behind the condensing lens to supply the first reflected light having passed through the condensing lens as second reflected light to pass through the condensing lens, whereby light straightness and light efficiency of the light emitting module are improved, and the size of the light emitting module is reduced.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

Reference will now be made in detail to the preferred embodiments of the present invention, examples of which are illustrated in the accompanying drawings.

Figure 1A:
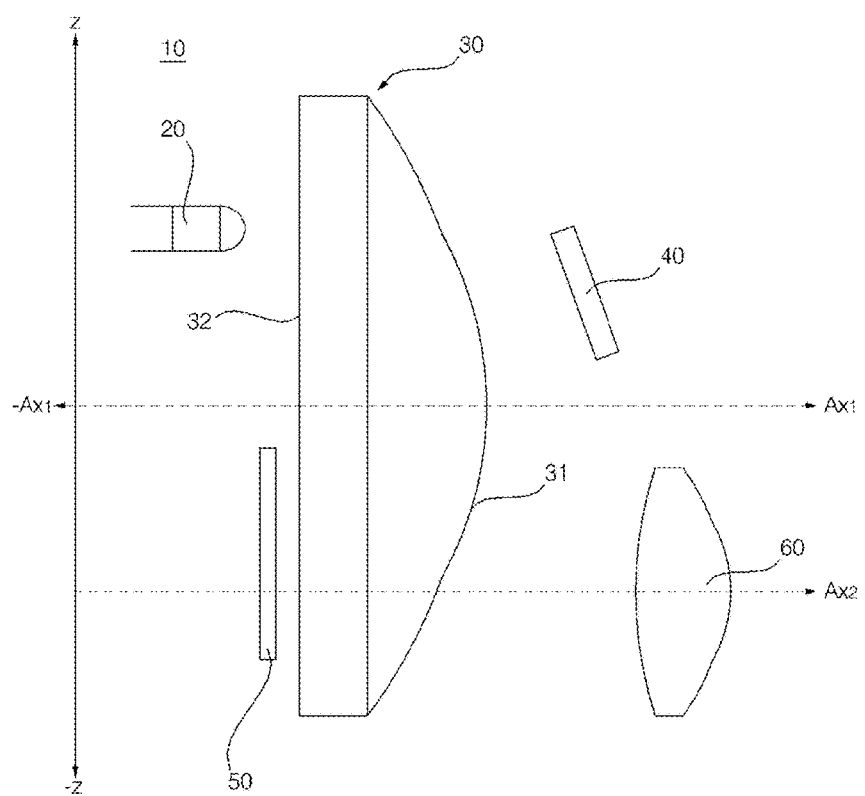
FIGS. 1A and 1B are conceptual views of a light emitting module according to an embodiment of the present invention when viewed in different directions.
Figure 1B:
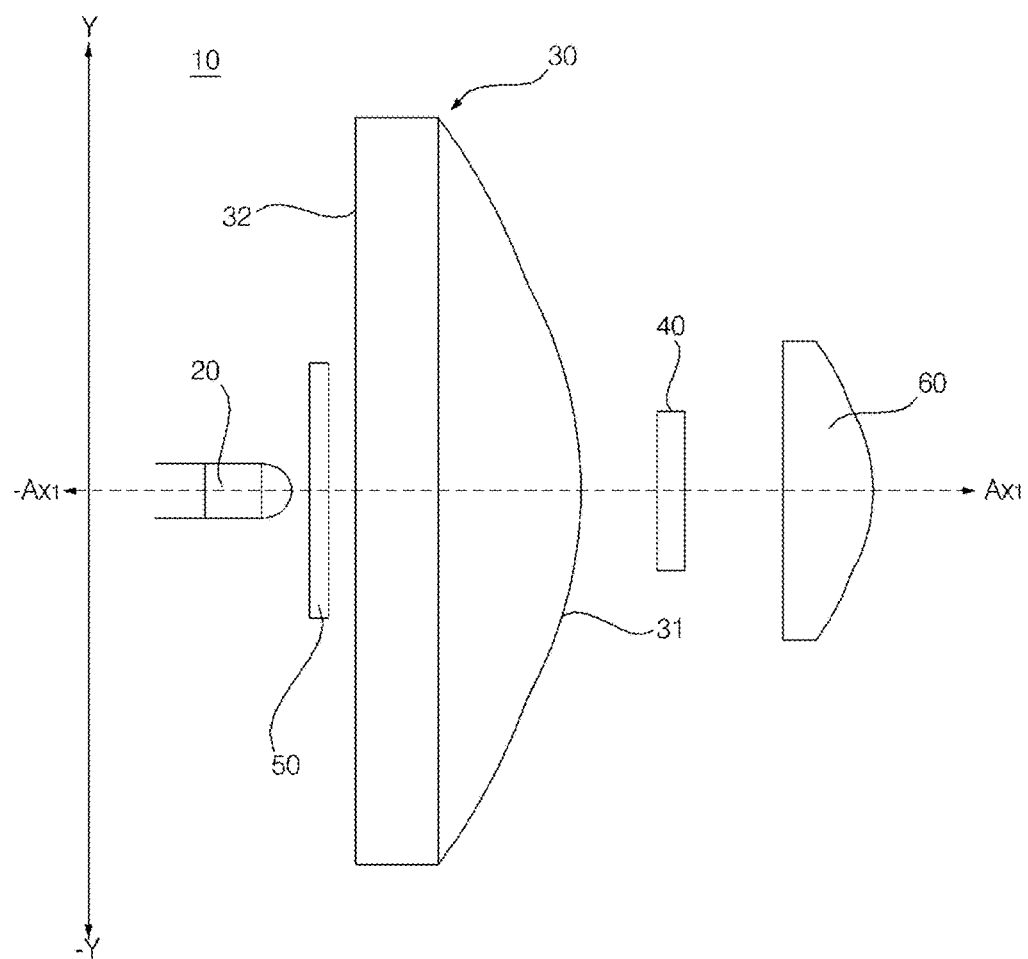
Figure 2:
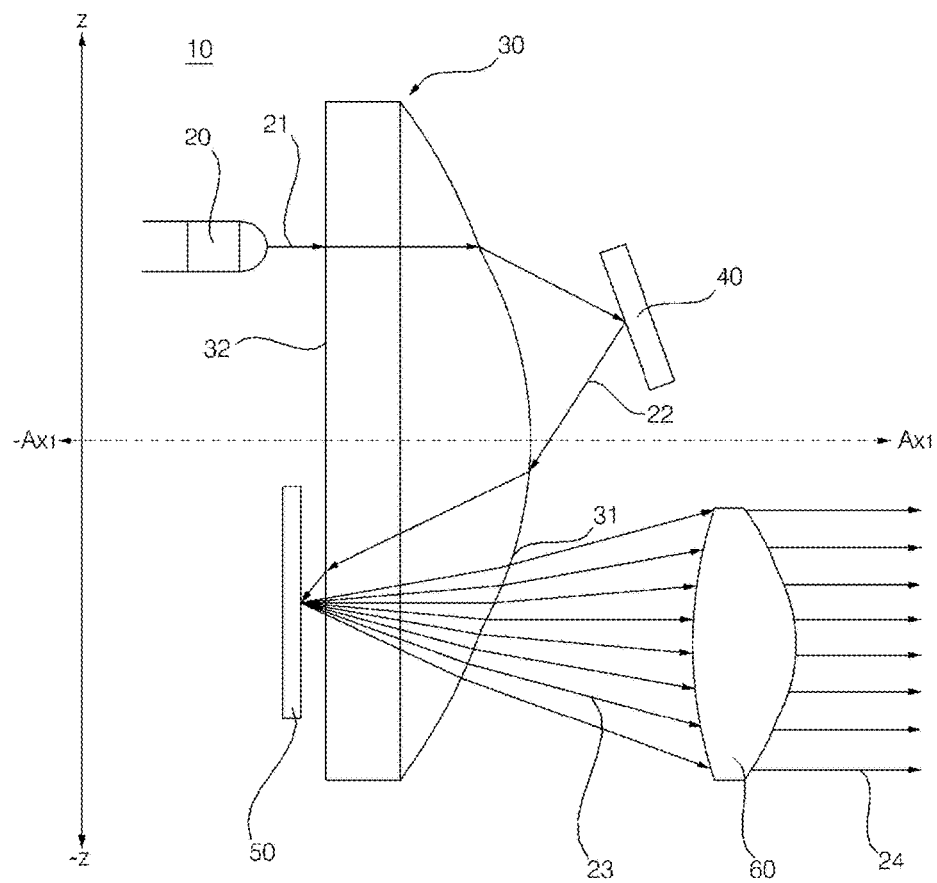
FIG. 2 is a conceptual view illustrating an optical path of the light emitting module according to the embodiment of the present invention.

FIGS. 1A and 1B are conceptual views of a light emitting module according to an embodiment of the present invention when viewed in different directions, and FIG. 2 is a conceptual view illustrating an optical path of the light emitting module according to the embodiment of the present invention.

Referring to FIGS. 1 and 2, a light emitting module 10 according to an embodiment of the present invention includes a condensing lens 30 for condensing incident light into a space in the front, a light source 20 disposed spaced apart from the condensing lens 30 in one direction, a first optical path conversion member 40, e.g., a reflector, disposed spaced apart from the condensing lens 30 in the other direction, which is opposite to one direction, and a second optical path conversion member 50, e.g., a reflector, disposed spaced apart from the condensing lens 30 in one direction, the second optical path conversion member 50 being spaced apart from the light source 20. Specifically, the light emitting module 10 according to the embodiment of the present invention includes a condensing lens 30 for condensing light incident from the rear into a front space, a light source 20 disposed behind the condensing lens 30 to emit first light 21 toward the condensing lens 30, a first optical path conversion member 40 disposed in front of the condensing lens 30 to reflect the first light 21, having passed through the condensing lens 30, and to supply first reflected light 22 to the condensing lens 30, and a second optical path conversion member 50 disposed behind the condensing lens 30 to supply the first reflected light 22, having passed through the condensing lens 30, as second reflected light 23 to pass through the condensing lens 30.

Here, the direction "front" refers to the right side (direction of Ax1) along a central axis Ax1 and −Ax1 (also referred to as an optical axis) of the condensing lens 30 in FIG. 1. The direction "rear" refers to the left side (direction of −Ax1) along the central axis Ax1 and −Ax1 of the condensing lens 30 in FIG. 1. The vertical direction refers to an upward and downward direction (direction of Z-axis), which is perpendicular to the optical axis in FIG. 1A, and the horizontal direction refers to the direction of the Y-axis in FIG. 1B, which is perpendicular to the optical axis and the vertical direction.

The light emitting module 10 according to the embodiment of the present invention includes a light source 20 for supplying light, a condensing lens 30 for condensing the light supplied by the light source 20, a first optical path conversion member 40 for reflecting the light radiated from the condensing lens 30 to supply first reflected light 22 to the condensing lens 30, and a second optical path conversion member 50 for reflecting the first reflected light 22 emitted from the condensing lens 30 to supply second reflected light 23 to the condensing lens 30.

A light emitting module 10 according to another embodiment of the present invention includes a condensing lens 30 for condensing light incident from the rear into a front space, a light source 20 disposed behind the condensing lens 30 to emit first light 21 toward the condensing lens 30, a first optical path conversion member 40 disposed in front of the condensing lens 30 to reflect the first light 21 and to supply first reflected light 22 to the condensing lens 30, a second optical path conversion member 50 disposed behind the condensing lens 30 to reflect the first reflected light 22 and to supply second reflected light 23 to the condensing lens 30, and an auxiliary condensing lens 60 disposed in front of the condensing lens 30 to condense the second reflected light 23, having passed through the condensing lens 30, in the forward direction.

The central axis Ax1 of the condensing lens 30 is an imaginary line which connects the focal point of a front surface 31 of the condensing lens 30 with the center of the condensing lens 30.

The condensing lens 30 functions to concentrate light incident from the rear of the optical axis on a predetermined spot in the front of the optical axis. The condensing lens 30 refracts the incident light due to the shape of the condensing lens 30 and the difference in refractive index between the condensing lens 30 and the outside. The refractive index of the condensing lens 30 may be greater than 1, and preferably, may range from 1.5 to 1.6.

For example, the condensing lens 30 includes a spherical lens or an aspherical lens. Preferably, the condensing lens 30 may be embodied as an aspherical lens.

The condensing lens 30 may have a shape that is convex in the front direction of the optical axis Ax. In another example, the condensing lens 30 may include a rear surface 32 which is perpendicular to the central axis Ax1 of the condensing lens 30, and a front surface 31 which is formed to be convex in the front direction of the condensing lens 30. Alternatively, the rear surface 32 may be formed to be concave in the front direction of the optical axis.

The front surface 31 of the condensing lens 30 is formed in a curve shape having a peak which lies on the central axis Ax1 of the condensing lens 30. In detail, the front surface 31 of the condensing lens 30 may be formed in a curve shape which has a focal point on the central axis Ax1 of the condensing lens 30 and multiple radii of curvature.

The condensing lens 30 refracts light that is incident parallel to the central axis Ax1 of the condensing lens 30, and concentrates the light on a predetermined spot in the front region of the optical axis. The condensing lens 30 may be made of various materials that light can penetrate.

The light source 20 functions to generate light by receiving electrical energy and converting the electrical energy into optical energy. For example, the light source 20 may be embodied as an ultra-high voltage (UHV) mercury lamp, a light emitting diode (LED), a laser diode (LD) or the like. Preferably, the light source 20 may be embodied as a laser diode having good light straightness and convergence.

Various power supplies may supply power to the light source 20. The power may be supplied by a printed circuit board (PCB), a metal core PCB, a flexible PCB, a ceramic PCB or the like.

Here, the laser diode is a semiconductor laser having two electrodes for performing laser processes. For example, the laser diode may have a GaAs, $Al_x Ga_{1-x}As$ double heterojunction structure.

The light source 20 may generate various colors of light. Preferably, the light source 20 generates blue-based light having good efficiency.

The light source 20 is disposed behind the condensing lens 30, and emits the first light 21 toward the condensing lens 30. The first light 21 is incident parallel to the central axis Ax1 (optical axis) of the condensing lens 30. Here, the term "parallel" does not refer to a parallel state in the mathematical sense, but refers to a substantially parallel state within the allowable range.

The first light 21 is incident into the condensing lens 30 through a point on the rear surface 32 of the condensing lens 30 that is located eccentrically from the central axis Ax1 of the condensing lens 30.

In detail, the condensing lens 30 may be divided into a first region and a second region by an imaginary section cut along the central axis Ax1 of the condensing lens 30.

For example, as shown in FIG. 1, the first region is an upper region (region in the direction of Z-axis) above the central axis Ax1 of the condensing lens 30. The second region is a lower region (region in the direction of −Z-axis) below the central axis Ax1 of the condensing lens 30. In this situation, the first light 21 is incident into the first region of the condensing lens 30.

To this end, the light source 20 is located eccentrically from the central axis Ax1 of the condensing lens 30. Specifically, the light source 20 is located eccentrically from the central axis Ax1 of the condensing lens 30 in the vertical direction (the direction of Z-axis and Z-axis). The light source 20 may be located eccentrically from the central axis Ax1 of the condensing lens 30 in the horizontal direction (the direction of Y-axis and −Y-axis). Alternatively, the light source 20 may be located so as to overlap the central axis Ax1 of the condensing lens 30 when viewed in the vertical direction.

The light source 20 is spaced apart from the central axis Ax1 of the condensing lens 30 in a first direction (direction of Z-axis) which is perpendicular to the central axis Ax1 of the condensing lens 30. The light source 20 and the second optical path conversion member 50 are located opposite each other across the central axis Ax1 of the condensing lens 30.

The first light 21 generated from the light source 20 is incident on a point that is eccentric from the central axis Ax1 of the condensing lens 30, is refracted from the front surface 31 of the condensing lens 30, and is then incident on the first optical path conversion member 40.

The first optical path conversion member 40 is disposed in front of the condensing lens 30, reflects the first light 21 having passed through the condensing lens 30, and supplies the first reflected light 22 to the condensing lens 30.

In detail, the first optical path conversion member 40 is arranged so that the first reflected light 22 can pass through the condensing lens 30 from the front surface 31 to the rear surface 32 thereof. The first optical path conversion member 40 may include a planar surface or a curved surface. According to the number of light sources 20, a plurality of first optical path conversion members 40 may be arranged in a stair shape. Further, the first optical path conversion member 40 may be rotatably structured so as to adjust the angle of the first reflected light 22.

In greater detail, in order to effectively arrange the components in the limited space of the lamp device for vehicles and increase the efficiency thereof, the first optical path conversion member 40 is arranged so that the first reflected light 22 is incident into the condensing lens 30 through a point on the front surface 31 of the condensing lens 30 that is located eccentrically from the central axis Ax1 of the condensing lens 30. At this time, it is preferable that the first reflected light 22 is incident into the second area of the condensing lens 30.

The spot of incidence of the front surface 31 of the condensing lens 30, on which the first reflected light 22 is incident, is located apart from the central axis Ax1 of the condensing lens 30 in a second direction. In other words, the first reflected light 22 is incident into another region of the condensing lens 30, which is opposite to the region of the condensing lens 30 into which the first light 21 is incident.

If the first optical path conversion member 40 is disposed on the central axis Ax1 of the condensing lens 30, it has a shortcoming in that the distance between the first optical path conversion member 40 and the light source is increased, and thus the overall length of the light emitting module 10 is increased.

Therefore, the first optical path conversion member 40 is located eccentrically from the central axis Ax1 of the condensing lens 30 in the vertical direction (the direction of Z-axis and Z-axis). The first optical path conversion member 40 may be located eccentrically from the central axis Ax1 of the condensing lens 30 in the horizontal direction (the direction of Y-axis and −Y-axis). Alternatively, the first optical path conversion member 40 may be located so as to overlap the central axis Ax1 of the condensing lens 30 when viewed in the vertical direction.

It is preferable that the first optical path conversion member 40 is disposed at a position spaced apart from the central axis Ax1 of the condensing lens 30 in the first direction (direction of Z-axis) which is perpendicular to the central axis Ax1 of the condensing lens 30.

For example, the first optical path conversion member 40 includes a reflection layer which has a reflection surface intersecting the optical axis. Here, the reflection layer may be made from a material having a good reflection property, for example, a material selected from the group consisting of Ag, Ni, Al, Rh, Pd, Ir, Ru, Mg, Zn, Pt, Au, Hf, and a combination thereof.

The reflection layer may have a structure in which a plurality of layers having different refractive indexes is alternately stacked.

The second optical path conversion member 50 is disposed behind the condensing lens 30, reflects the first reflected light 22 having passed through the condensing lens 30, and supplies the second reflected light 23 to the condensing lens 30.

The second optical path conversion member 50 may function only to reflect the light, or, additionally, to convert a wavelength of the light while reflecting the light. For example, the second optical path conversion member 50 may convert the wavelength of the blue-based light emitted from the light source 20 and generate white-based light. The detailed structure of the second optical path conversion member 50 will be described later. According to the purpose of the light emitting module 10, the second optical path conversion member 50 may be structured only to reflect the light, or, additionally, to convert the wavelength of the light during the reflection. Accordingly, the second reflected light 23 reflected from the second optical path conversion member 50 may have a wavelength that is different from that of the first reflected light 22.

The second optical path conversion member 50 is disposed behind the condensing lens 30, and supplies the second reflected light 23 to the condensing lens 30.

The first reflected light 22, which is incident on the front surface 31 of the condensing lens 30 from the first optical path conversion member 40, is refracted at the boundary surfaces of the condensing lens 30, and is radiated from the rear surface 32 of the second region of the condensing lens 30. The first reflected light 22, having passed through the condensing lens 30, is incident on the second optical path conversion member 50, and is reflected as the second reflected light 23 from the second optical path conversion member 50. The second reflected light 23 is incident on a region of the rear surface 32 that is eccentric from the central axis Ax1 of the condensing lens 30. In detail, the second reflected light 23 is incident on the second region of the rear surface 32 of the condensing lens 30. The second reflected light 23, which is incident on the condensing lens 30, is refracted at the boundary surfaces of the condensing lens 30, and is radiated to the front through the front surface 31 of the condensing lens 30.

Light emitted from the light source 20 is focused while sequentially passing through the upper half part of the condensing lens 30, the first optical path conversion member 40, the lower half part of the condensing lens 30, the second optical path conversion member 50, and the lower half part of the condensing lens 30. The upper half part of the condensing lens 30 is the upper region of the condensing lens 30 on the basis of the central axis Ax1 of the condensing lens 30. The upper half part of the condensing lens 30 is a first region of the condensing lens 30. The lower half part of the condensing lens 30 is the lower region of the condensing lens 30 on the basis of the central axis Ax1 of the condensing lens 30. The lower half part of the condensing lens 30 is a second region of the condensing lens 30.

The first light 21 is generated by the light source 20, passes through the condensing lens 30, and is supplied to the first optical path conversion member 40. The first light 21 is reflected by the first optical path conversion member 40, and passes through the condensing lens 30, whereby the first reflected light 22 is formed. The first reflected light 22 is supplied to the second optical path conversion member 50. The first reflected light 22 is reflected by the second optical path conversion member 50, and passes through the condensing lens 30, whereby the second reflected light 23 is formed.

The reflection property of light will now be described as follows.

Light may be specularly reflected or diffusely reflected based on the surface property of the reflector.

Diffuse reflection may include Gaussian reflection, Lambertian reflection, and mixed reflection.

In general, specular reflection is reflection in which, when light is incident on a point of the reflector, an angle between a normal line passing the point and an optical axis of the incident light is equal to an angle between the normal line and an optical axis of reflected light.

Gaussian reflection is reflection in which intensity of reflected light based on an angle at the surface of the reflector and an angle between a normal line and the reflected light vary according to values of a Gaussian function.

Lambertian reflection is reflection in which intensity of reflected light based on an angle at the surface of the reflector and an angle between a normal line and the reflected light vary according to values of a cosine function.

The mixed reflection includes at least one selected from among specular reflection, Gaussian reflection and Lambertian reflection.

In one embodiment, the first optical path conversion member 40 specularly reflects light for light focusing. In the case in which the second optical path conversion member 50 functions only to reflect light, the second optical path conversion member 50 specularly reflects light.

In another embodiment, in the case in which the second optical path conversion member 50 is configured to perform both reflection and wavelength conversion, the second optical path conversion member 50 has a structure including a reflection layer and a phosphor layer coated on the reflection layer. When the second optical path conversion member 50 performs reflection and wavelength conversion, the second reflected light 23 from the second optical path conversion member 50 undergoes Lambertian reflection or mixed reflection. Accordingly, when the second optical path conversion member 50 performs reflection and wavelength conversion, the second reflected light 23 is radiated ahead of the optical axis Ax. In other words, the second reflected light 23 becomes fan-shaped light which is directed at a predetermined angle in upper and lower directions based on an arbitrary line parallel to the central axis Ax1 of the condensing lens 30.

Preferably, the reflection surface of the second optical path conversion member 50 is arranged perpendicular to the central axis Ax1 of the condensing lens 30.

The second reflected light 23 is incident on the second region of the rear surface 32 of the condensing lens 30, is refracted at the boundary surfaces of the condensing lens 30, and is radiated from the condensing lens 30. The second reflected light 23 having passed through the condensing lens 30 has a smaller radiation angle than the second reflected light 23 that is incident into the condensing lens 30.

Accordingly, the second reflected light 23 having passed through the condensing lens 30 is diffused while having a certain degree of straightness. Such second reflected light 23 may be used as a low beam in a lamp device for vehicles, which illuminates a region spaced apart by a short distance.

The second optical path conversion member 50 is disposed behind the condensing lens 30 such that the second optical path conversion member 50 is spaced apart from the light source 20. In a case in which the second optical path conversion member 50 is spaced apart from the light source 20, thermal concentration is maximally prevented, since these members, from which heat is generated, are spaced apart from each other. Specifically, second optical path conversion member 50 is disposed spaced apart from the central axis Ax1 of the condensing lens 30 in the second direction (direction of −Z-axis) which is perpendicular to the central axis Ax1 of the condensing lens 30. The second optical path conversion member 50 is located opposite the light source 20 across the central axis Ax1 of the condensing lens 30.

In a further embodiment, the second reflected light 23 may be converted into light that is substantially parallel to the optical axis so as to be used as a high beam for illuminating a region spaced apart by a long distance. In this case, the light emitting module according to this embodiment may further include an auxiliary condensing lens 60 for concentrating the second reflected light 23 having passed through the condensing lens 30 on a predetermined spot in the front.

The auxiliary condensing lens 60 functions to concentrate light incident from the rear of the optical axis in the forward direction of the optical axis. The auxiliary condensing lens 60 refracts the incident light due to the shape of the auxiliary condensing lens 60 and the difference in refractive index between the auxiliary condensing lens 60 and the outside. The refractive index of the auxiliary condensing lens 60 may be greater than 1, and may preferably range from 1.5 to 1.6.

The auxiliary condensing lens 60 is decentered with respect to the central axis Ax1 of the condensing lens 30. In particular, the central axis Ax2 of the auxiliary condensing lens 60 is decentered with respect to the central axis Ax1 of the condensing lens 30.

The central axis Ax2 of the auxiliary condensing lens 60 is decentered in the vertical direction (direction of Z-axis/−Z-axis) with respect to the central axis Ax1 of the condensing lens 30. The central axis Ax2 of the auxiliary condensing lens 60 may be decentered in the horizontal direction (direction of Y-axis/−Y-axis) with respect to the central axis Ax1 of the condensing lens 30, or may be located so as to overlap the central axis Ax1 of the condensing lens 30 when viewed in the vertical direction. In particular, the central axis Ax2 of the auxiliary condensing lens 60 is decentered in the second direction (direction of −Z-axis) with respect to the central axis Ax1 of the condensing lens 30.

Also, the central axis Ax2 of the auxiliary condensing lens 60 may be located within the second region of the condensing lens 30. Preferably, the central axis Ax2 of the auxiliary condensing lens 60 is located parallel to the central axis Ax1 of the condensing lens 30.

The light incident into the auxiliary condensing lens 60 from the rear is refracted at the boundary surfaces of the auxiliary condensing lens 60, and is radiated parallel to the optical axis.

The light, whose wavelength is converted and which is reflected from the second optical path conversion member 50, is incident into the auxiliary condensing lens 60, similar to the light incident from the focal point position of the auxiliary condensing lens 60, and is therefore efficiently converted into light parallel to the optical axis. The auxiliary condensing lens 60 may be made from the same material as the condensing lens 30.

However, since the light source 20 is decentered with respect to the central axis of the condensing lens 30 and the light is incident eccentrically with respect to the central axis of the condensing lens 30, off-axis aberration occurs when the second reflected light 23 is incident into the auxiliary condensing lens 60.

Therefore, the auxiliary condensing lens 60 has a structure for removing the off-axis aberration while concentrating the incident light. The detailed structure of the auxiliary condensing lens 60 will be described hereinafter.

Figure 3:
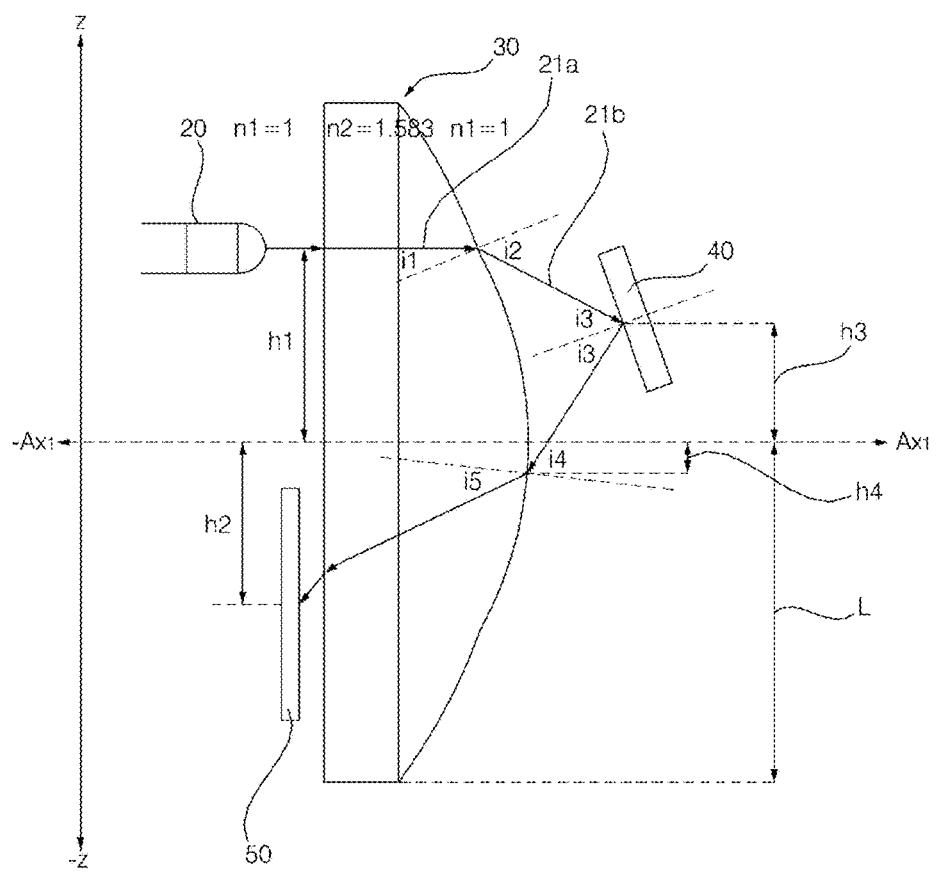
FIGS. 3 and 4 are reference views for explaining refraction and reflection of the light emitting module according to the embodiment of the present invention.
Figure 4:
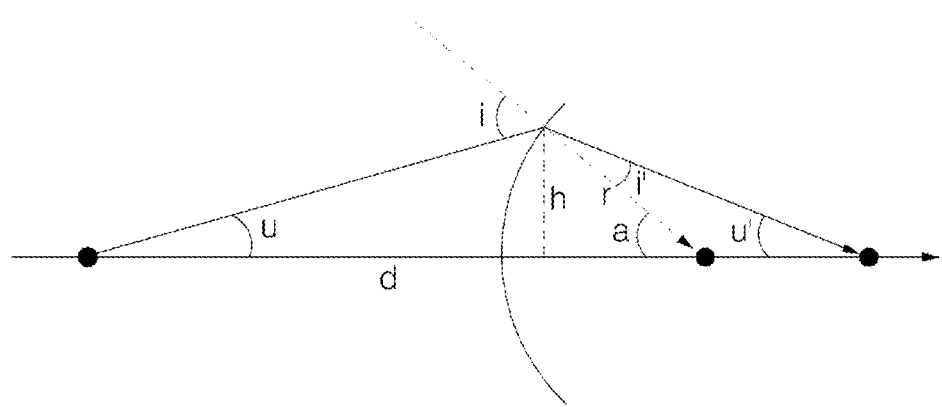

FIGS. 3 and 4 are reference views for explaining refraction and reflection of the light emitting module 10 according to the embodiment of the present invention.

First, referring to FIG. 4, Snell's law related to light refraction is as follows.

$$n \sin i = n' \sin i'$$

A refraction formula is deduced by transforming Snell's law as follows.

$$ni \cong n'i'$$
$$n(\alpha - u) = n'(\alpha - u')$$
$$n\left(\frac{h}{r} - u\right) = n'\left(\frac{h}{r} - u'\right)$$
$$n'u' = nu + \frac{h}{r}(n' - n)$$

Where n refers to a refractive index of a medium before refraction, n' refers to a refractive index of the medium after refraction, i refers to an angle between a plane onto which light is incident and a vertical plane, and i' refers to an angle between radiated light and the vertical plane.

Using the above refraction formula, a distance h of each component from the central axis Ax1 of the condensing lens 30 can be calculated as follows.

$$n'u' = nu + \frac{h}{r}(n' - n) \Rightarrow h = \frac{r(n'u' - nu)}{(n' - n)}$$

Where r refers to a radius of curvature of the lens.

The condensing lens 30 in this embodiment is embodied as an aspherical lens, in which a radius of curvature of a center portion is smaller than that of an edge portion.

When observed from the front of the central axis Ax1 of the condensing lens 30, the light source 20, the first optical path conversion member 40 and the second optical path conversion member 50 are disposed at positions that overlap the condensing lens 30. Therefore, the housing accommodating the light emitting module 10 may be reduced to the size of the condensing lens 30.

In detail, a first distance h1 between the central axis Ax1 of the condensing lens 30 and the light source 20 is smaller than a radius L of the condensing lens 30. Here, the first distance h1 is calculated using the above-mentioned distance calculation formula.

A second distance h2 between the central axis Ax1 of the condensing lens 30 and the second optical path conversion member 50 is smaller than the radius L of the condensing lens 30. The second distance h2 is also calculated using the above-mentioned distance calculation formula. The second optical path conversion member 50 is located behind the condensing lens 30, and more precisely, at a position adjacent to the rear surface 32 of the condensing lens 30.

Preferably, the first distance h1 of the light source 20 and the second distance h2 of the second optical path conversion member 50 may be equal. More preferably, a ratio of the first distance h1 to the second distance h2 may be in the range of 1:0.7 to 1:1.1. Much more preferably, the ratio of the first distance h1 to the second distance h2 may be in the range of 1:0.94 to 1:0.98.

A third distance h3 between the central axis Ax1 of the condensing lens 30 and the first optical path conversion member 40 is greater than 0 and smaller than the radius L of the condensing lens 30. The third distance h3 is also calculated using the above-mentioned distance calculation formula. Preferably, a ratio of the first distance h1 to the third distance h3 may be in the range of 1:0.5 to 1:0.9. More preferably, the ratio of the first distance h1 to the third distance h3 may be in the range of 1:0.6 to 1:0.8.

A fourth distance h4 between the central axis Ax1 of the condensing lens 30 and the spot of incidence of the first reflected light 22 may be smaller than the first distance h1 or the second distance h2. Preferably, a ratio of the first distance h1 of the light source 20 to the fourth distance h4 of the spot of incidence may be in the range of 1:0.1 to 1:0.6. More preferably, the ratio of the first distance h1 of the light source 20 to the fourth distance h4 of the spot of incidence may be in the range of 1:0.35 to 1:0.37.

For convenience of assembly, the light emitting module 10 is generally accommodated in a hexahedron-shaped housing. By disposing the light source 20 at the upper portion behind the condensing lens 30 and disposing the second optical path conversion member 50 at the lower portion behind the condensing lens 30, the length of the light emitting module 10 may be reduced, and space utilization may be maximized. As a result, the light emitting module 10 may be easily accommodated in the housing.

Further, by disposing the auxiliary condensing lens 60 at the lower portion in front of the condensing lens 30 and disposing the first optical path conversion member 40 at the upper portion in front of the condensing lens 30, the length of the light emitting module 10 may be reduced, and space utilization may be maximized, so that the light emitting module 10 can be easily accommodated in the housing.

Figure 5A:
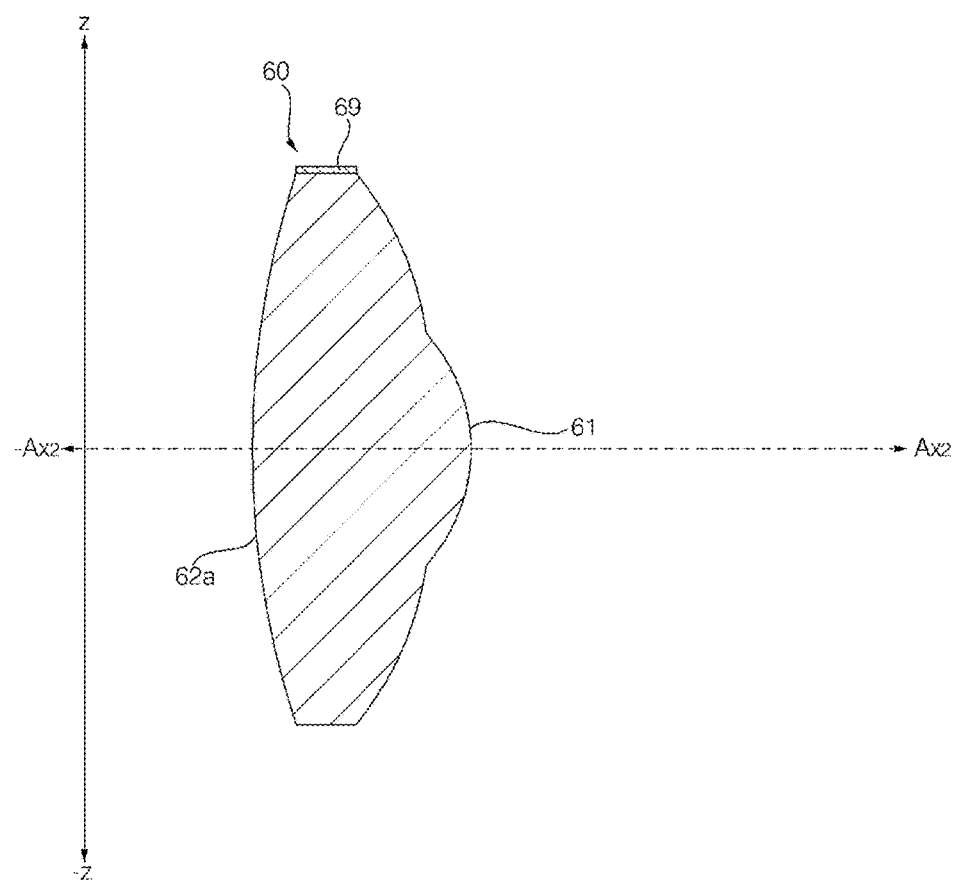
FIG. 5A is a longitudinal sectional view cut through an auxiliary condensing lens according to an embodiment of the present invention in the vertical direction.
Figure 5B:
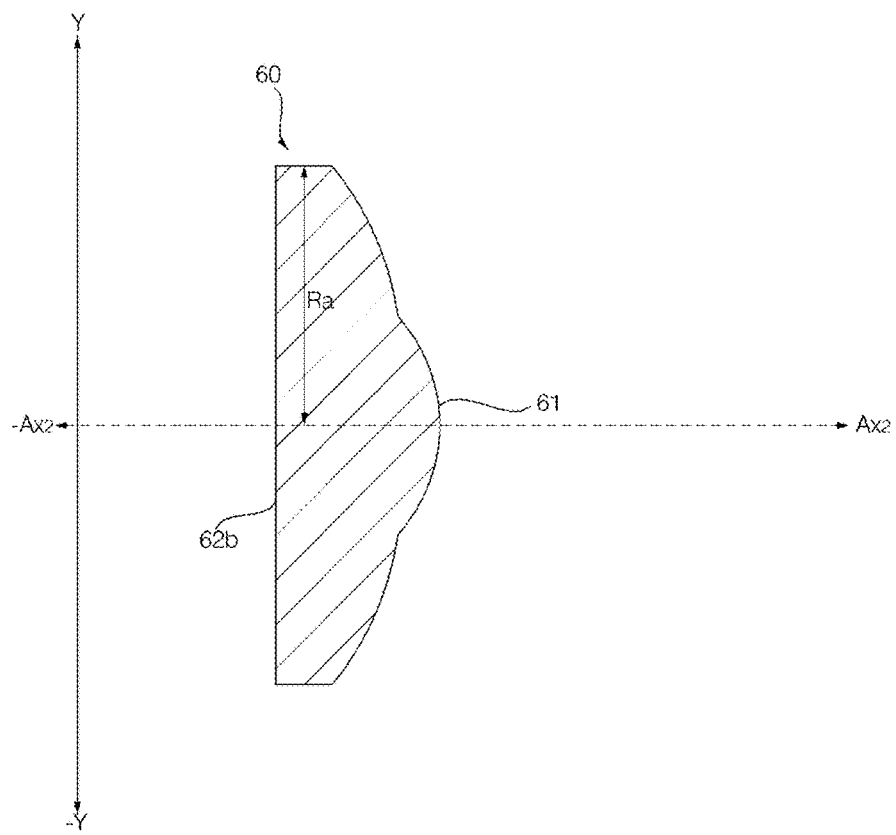
FIG. 5B is a cross sectional view cut through the auxiliary condensing lens according to the embodiment of the present invention in the horizontal direction

FIG. 5A is a longitudinal sectional view cut through an auxiliary condensing lens according to an embodiment of the present invention in the vertical direction, and FIG. 5B is a cross sectional view cut through the auxiliary condensing lens according to the embodiment of the present invention in the horizontal direction. Preferably, the central axis Ax2 of the auxiliary condensing lens 60 lies in the longitudinal section and the cross section of the auxiliary condensing lens.

Referring to FIGS. 1 and 5, the auxiliary condensing lens 60 includes a first refractive surface 62a and 62b and a second refractive surface 61 to mitigate off-axis aberration and concentrate light in the forward direction.

The first refractive surface 62a and 62b is the surface of the auxiliary condensing lens 60 that is exposed toward the condensing lens 30. The first refractive surface 62a and 62b defines the rear surface of the auxiliary condensing lens 60. The first refractive surface 62a and 62b is disposed opposite to the second refractive surface 61.

The first refractive surface 62a and 62b also acts as a boundary surface with respect to the outside of the auxiliary condensing lens 60, on which the second reflected light 23 is incident. The second reflected light 23 is refracted at the first refractive surface 62a and 62b. The first refractive surface 62a and 62b has a shape that compensates for off-axis aberration.

The first refractive surface 62a and 62b includes a vertical refractive section 62a and a horizontal refractive section 62b when viewed from different directions. The vertical refractive section 62a, as shown in FIG. 5A, is a section observed in a longitudinal section cut through the auxiliary condensing lens 60 in the vertical direction. The horizontal refractive section 62b, as shown in FIG. 5B, is a section observed in a cross-section cut through the auxiliary condensing lens 60 in the horizontal direction.

In order to compensate for off-axis aberration, the vertical refractive section 62a and the horizontal refractive section 62b may have different shapes from each other. In an example, the vertical refractive section 62a is curved with a predetermined radius of curvature, and the horizontal refractive section 62b is flat.

In particular, the horizontal refractive section 62b may be substantially flat, or may be curved with a very large radius of curvature. The vertical refractive section 62a may be convex toward the rear of the auxiliary condensing lens 60. The center of curvature of the vertical refractive section 62a is located in front of the auxiliary condensing lens 60.

In another example, the vertical refractive section 62a and the horizontal refractive section 62b may be curved with different radii of curvature. In particular, the radius of curvature of the vertical refractive section 62a is less than that of the horizontal refractive section 62b. More particularly, the radius of curvature of the horizontal refractive section 62b is 5 times or more of that of the vertical refractive section 62a.

The centers of curvature of the horizontal refractive section 62b and the vertical refractive section 62a are located in front of the auxiliary condensing lens 60. Preferably, the centers of curvature of the horizontal refractive section 62b and the vertical refractive section 62a are located on the central axis Ax1 of the condensing lens 30 in front of the auxiliary condensing lens 60.

Described in detail, the first refractive surface 62a and 62b is, overall, shaped as a segment of a toroid having a central axis that extends in the horizontal direction. That is, the first refractive surface 62a and 62b of the auxiliary condensing lens 60 is curved in the vertical direction, thereby compensating for off-axis aberration occurring in the vertical direction.

Preferably, the radius of curvature of the vertical refractive section 62a is 8 to 15 times the radius Ra of the auxiliary condensing lens 60. The vertical refractive section 62a may be a curve whose vertex is on the central axis Ax2 of the auxiliary condensing lens 60.

The second refractive surface 61 is the surface of the auxiliary condensing lens 60 that is exposed to the front of the auxiliary condensing lens 60. The second refractive surface 61 defines the front surface of the auxiliary condensing lens 60. The second refractive surface 61 is disposed opposite to the first refractive surface 62a and 62b.

The second refractive surface 61 also acts as a boundary surface with respect to the outside of the auxiliary condensing lens 60, from which the second reflected light 23 is radiated. The second reflected light 23 is refracted at the second refractive surface 61. The second refractive surface 61 has a shape that concentrates light.

In an example, the second refractive surface 61 of the auxiliary condensing lens 60 has a spherical or aspherical shape. Particularly, the second refractive surface 61 has a shape that is symmetric in the horizontal direction and the vertical direction.

More particularly, the second refractive surface 61 may be convex in the forward direction. Preferably, the second refractive surface 61 may be a curve whose vertex is on the central axis Ax2 of the auxiliary condensing lens 60. More preferably, the second refractive surface 61 may be configured as a combination of curves having centers of curvature located at the rear of the auxiliary condensing lens 60 and different radii of curvature. The radius of curvature of the center portion in the second refractive surface 61 may be less than that of the peripheral portion in the second refractive surface 61.

Figure 6A:
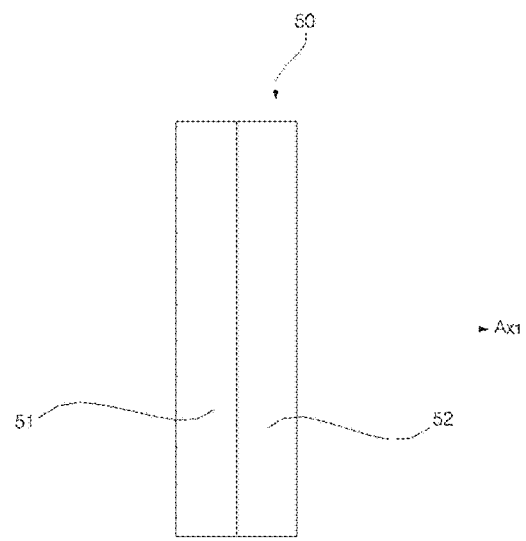
FIG. 6A is a sectional view of a second optical path conversion member according to an embodiment of the present invention.
Figure 6B:
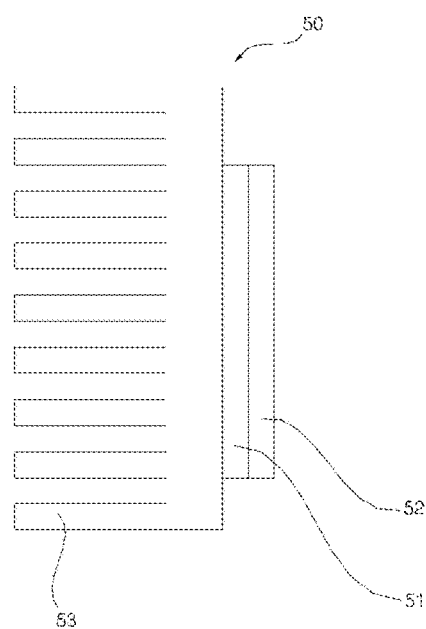
FIG. 6B is a sectional view of a second optical path conversion member according to another embodiment of the present invention.

FIG. 6A is a sectional view of a second optical path conversion member according to an embodiment of the present invention, and FIG. 6B is a sectional view of a second optical path conversion member according to another embodiment of the present invention.

Referring to FIG. 6A, the second optical path conversion member 50 according to an embodiment of the present invention includes a wavelength conversion layer 52 for converting a wavelength of the incident light, and a reflection layer 51 for reflecting the incident light.

The boundary surface of the reflection layer 51 is arranged perpendicular to the optical axis Ax1. The reflection layer 51 may be made from a material having a good reflection property, for example, a material selected from the group consisting of Ag, Ni, Al, Rh, Pd, Ir, Ru, Mg, Zn, Pt, Au, Hf, and a combination thereof.

The wavelength conversion layer 52 functions to convert the wavelength of the incident light. In detail, blue-based light is incident into the wavelength conversion layer 52 and is converted into white-based light.

The wavelength conversion layer 52 is arranged in front of the reflection layer 51. Accordingly, the wavelength of the first reflected light 22, which is incident into the wavelength conversion layer 52, is converted while passing through the wavelength conversion layer 52, and the first reflected light 22 is reflected from the reflection layer 51 and converted into the second reflected light 23, which will subsequently pass through the condensing lens 30.

For example, the wavelength conversion layer 52 may have a structure in which phosphors are spread on a base layer, such as transparent silicon or the like. The kind of phosphor is selected based on the wavelength of the light emitted from the light source 20, so that the light emitting module 10 emits white light.

Based on the wavelength of the light emitted from the light source 20, the phosphor may be embodied as one of a blue light emitting phosphor, a blue-green light emitting phosphor, a green light emitting phosphor, a yellow-green light emitting phosphor, a yellow light emitting phosphor, a yellow-red light emitting phosphor, an orange light emitting phosphor, and a red light emitting phosphor.

In detail, when the light source 20 is a blue laser diode and the phosphor is a yellow phosphor, the yellow phosphor may emit yellow light by being excited by blue light, and the blue light from the blue laser diode and the yellow light generated by being excited by the blue light are mixed. As a result, the light emitting module 10 may emit white light.

In another example, the wavelength conversion layer 52 may be embodied as a coating layer or a film layer. Particularly, the wavelength conversion layer 52 may include yellow opto-ceramic, which has higher thermal stability than a conventional phosphor.

In a further example, as shown in FIG. 5B, the second optical path conversion member 50 may further include a heat sink 53 which is coupled to one surface of the reflection layer 51. The heat sink 53 functions to dissipate heat from the second optical path conversion member 50 so as to improve the thermal stability of the second optical path conversion member 50.

Figure 7A:
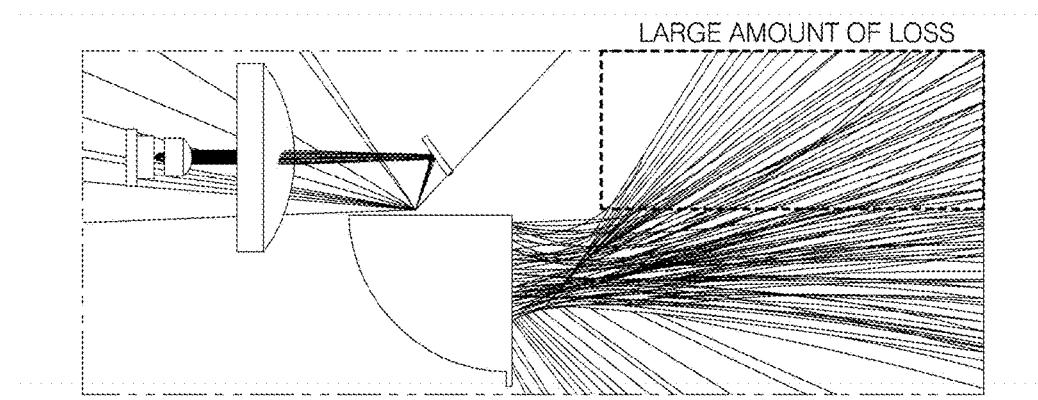
FIG. 7A is a view illustrating an optical path of a conventional light emitting module.
Figure 7B:
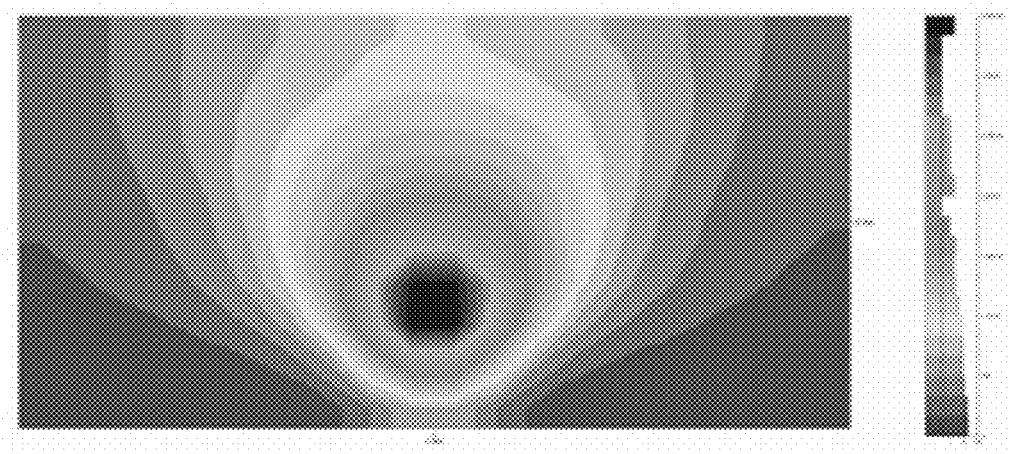
FIG. 7B is a view illustrating a projection image of the conventional light emitting module.

FIG. 7A is a view illustrating an optical path of a conventional light emitting module, and FIG. 7B is a view illustrating a projection image of the conventional light emitting module.

Referring to FIG. 7A, the conventional light emitting module operates such that light from a light source disposed on an optical axis is incident into a condensing lens, passes through the condensing lens, and is radiated therefrom. The light concentrated by the condensing lens is refracted by a reflection unit disposed on the optical axis, and passes through a light transmissive phosphor. A wavelength of the light is converted while passing through the light transmissive phosphor.

The light incident into the light transmissive phosphor from the reflection unit is concentrated on one point; however, the light radiated from the light transmissive phosphor spreads out radially. At the time of passing through the light transmissive phosphor, the optical efficiency is considerably deteriorated.

The light from the light transmissive phosphor is radiated ahead of the optical axis by a spherical mirror.

Some of the light from the spherical mirror is projected parallel to the optical axis, but some of the light is projected in a non-parallel direction relative to the optical axis, which causes optical loss.

From FIG. 7B, illustrating a projection image at 20 meters ahead of the light source, it can be known that some of the light is concentrated, but some of the light is wasted by being directed upward.

Figure 8A:
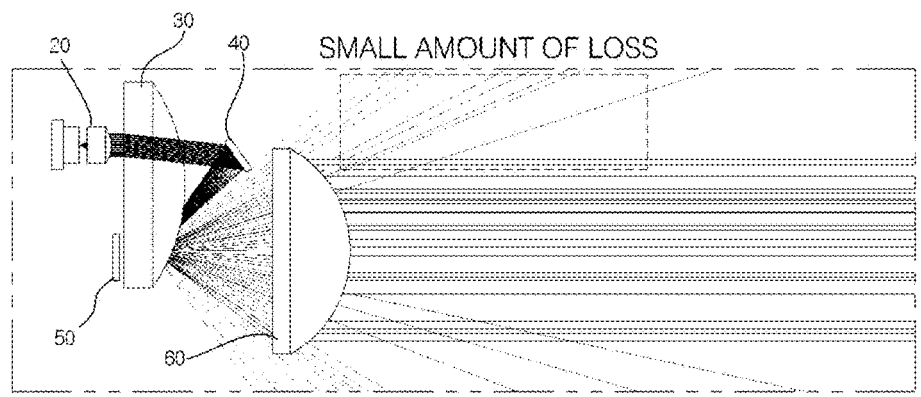
FIG. 8A is a view illustrating an optical path of the light emitting module according to the present invention.
Figure 8B:
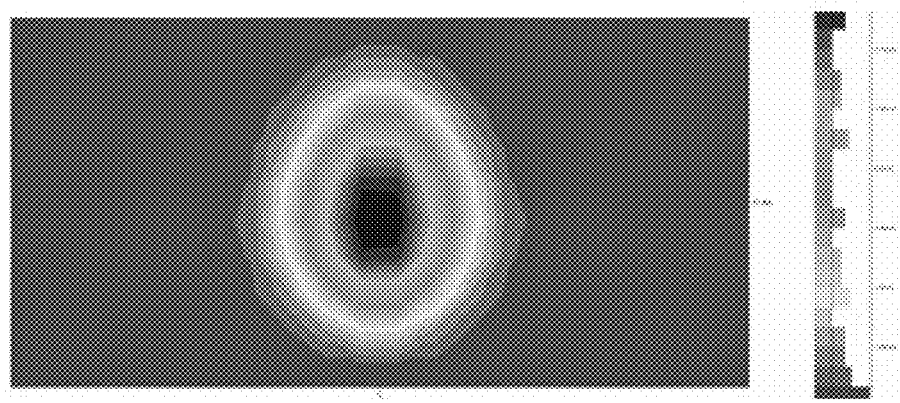
FIG. 8B is a view illustrating a projection image of the light emitting module according to the present invention.

FIG. 8A is a view illustrating an optical path of the light emitting module according to the present invention, and FIG. 8B is a view illustrating a projection image of the light emitting module according to the present invention.

Referring to FIG. 8A, the first light 21 generated from the light source 20 is incident into the upper region (first region) of the condensing lens 30, is refracted, and is radiated from the condensing lens 30. The first light 21 radiated from the condensing lens 30 is incident on the first optical path conversion member 40.

The first light 21 incident on the first optical path conversion member 40 is reflected therefrom, and is radiated as the first reflected light 22. The first reflected light 22 is incident into the lower region (second region) of the condensing lens 30. The first reflected light 22 is radiated rearward through the lower region of the condensing lens 30.

The first reflected light 22 radiated from the condensing lens 30 is incident on the second optical path conversion member 50. The first reflected light 22 is converted into white light at the second optical path conversion member 50 by wavelength conversion, is reflected from the second optical path conversion member 50, and is radiated as the second reflected light 23.

At this time, since the second reflected light 23 undergoes Lambertian reflection, the second reflected light 23 becomes fan-shaped light which is directed at a predetermined angle based on an arbitrary line parallel to the optical axis.

The second reflected light 23 is incident into the lower region of the condensing lens 30, is refracted, and is radiated ahead of the condensing lens 30.

The second reflected light 23 radiated from the condensing lens 30 is concentrated by the auxiliary condensing lens 60, and is radiated as the second light 24.

The majority of the second reflected light 23 is incident into the auxiliary condensing lens 60, and is refracted to be parallel light.

From FIG. 8B, illustrating a projection image at 20 meters ahead of the light source 20, it can be known that the majority of the light is concentrated on a small region.

Figure 9A:
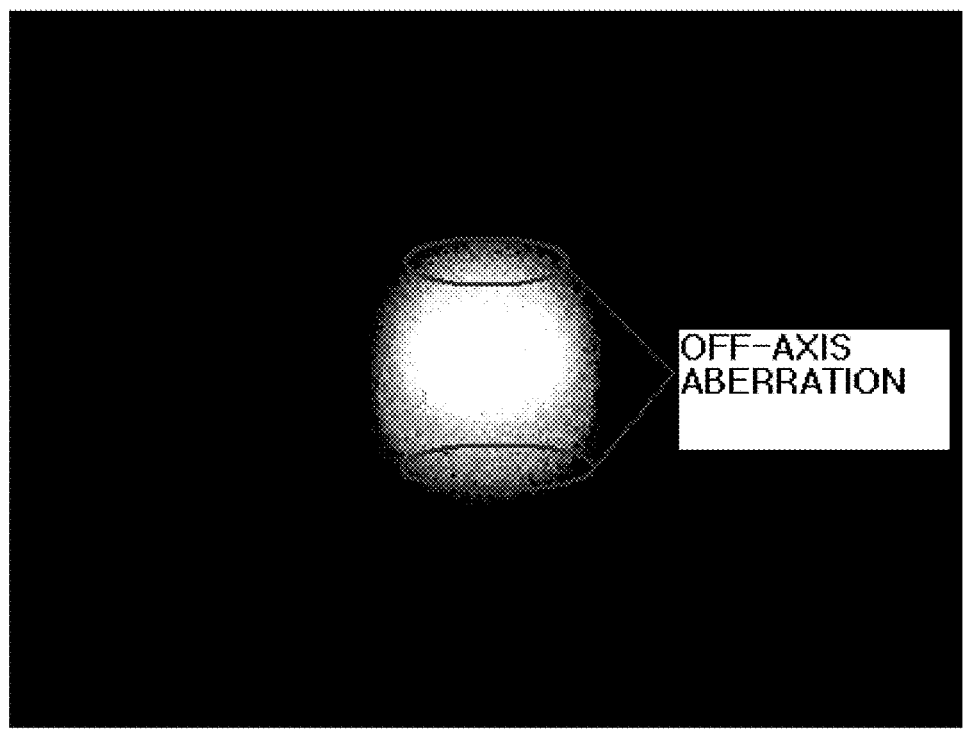
FIG. 9A is a view illustrating a projection image of a light emitting module according to a comparative example.
Figure 9B:
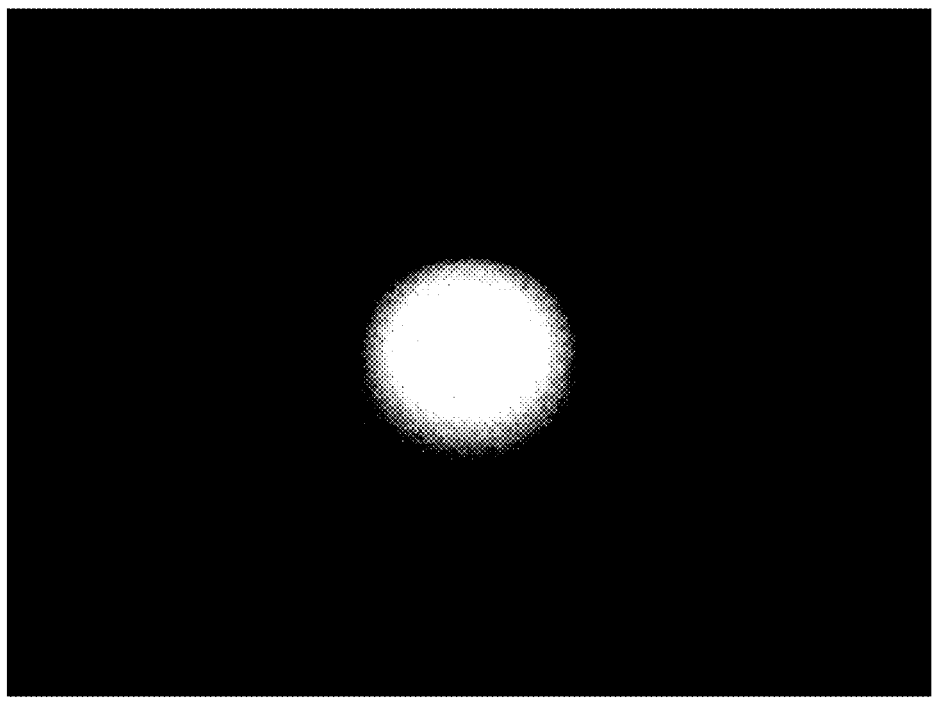
FIG. 9B is a view illustrating a projection image of the light emitting module according to the present invention.

FIG. 9A is a view illustrating a projection image of a light emitting module according to a comparative example, and FIG. 9B is a view illustrating a projection image of the light emitting module according to the present invention.

In the comparative example of FIG. 9A, the structure for removing the off-axis aberration is not applied to the first refractive surface 62a and 62b of the auxiliary condensing lens 60.

Referring to FIG. 9A, in the light emitting module according to the comparative example, the light source 20 is decentered with respect to the central axis of the condensing lens 30, and light is incident eccentrically with respect to the central axis of the condensing lens 30. When light is radiated from the auxiliary condensing lens 60, therefore, off-axis aberration occurs in the vertical direction.

Specifically, the light radiated from the auxiliary condensing lens 60 of the comparative example does not become a true circle, but becomes an oval having a vertical diameter greater than a horizontal diameter, with the result that the light cannot be concentrated on a desired spot. In addition, the light radiated from the auxiliary condensing lens 60 of the comparative example does not become white light, but becomes light having different colors at the upper and lower parts thereof.

Referring to FIG. 9B, it can be seen that, in a case in which the auxiliary condensing lens 60 of the embodiment of the present invention is used, off-axis aberration in the vertical direction is removed.

Specifically, light radiated from the auxiliary condensing lens 60 of the embodiment of the present invention becomes almost circular white light as the result of the off-axis aberration being removed.

Figure 10A:
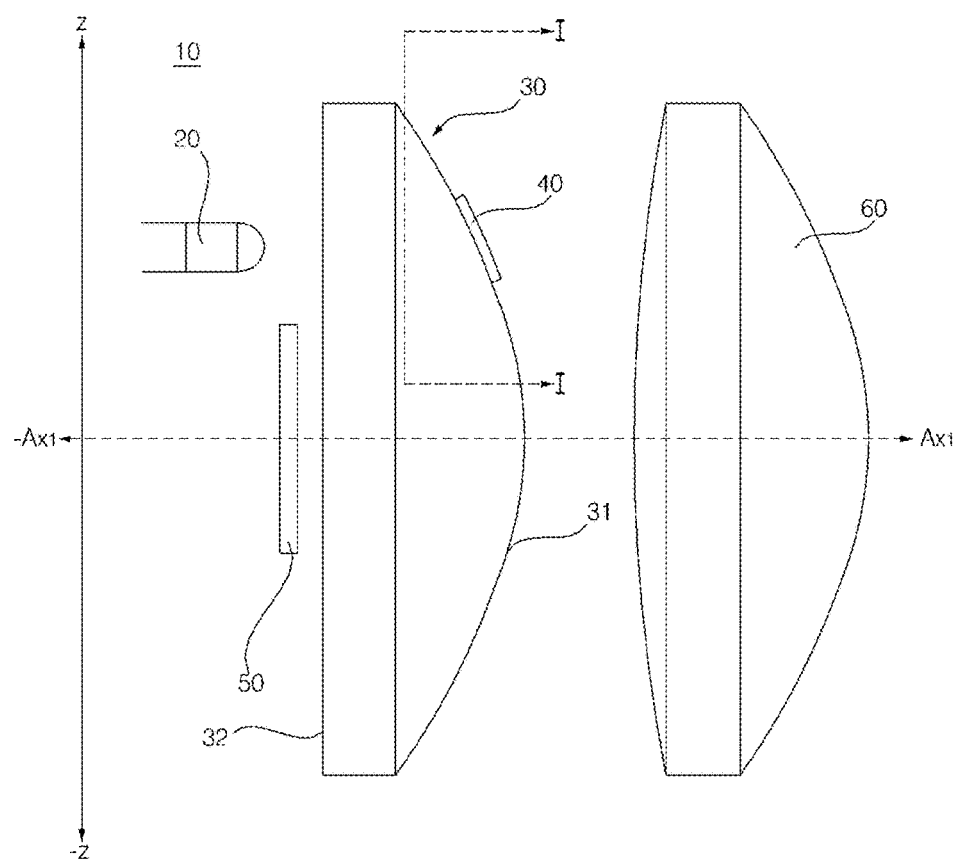
FIGS. 10A and 10B are conceptual views of a light emitting module according to an embodiment of the present invention when viewed in different directions.
Figure 10B:
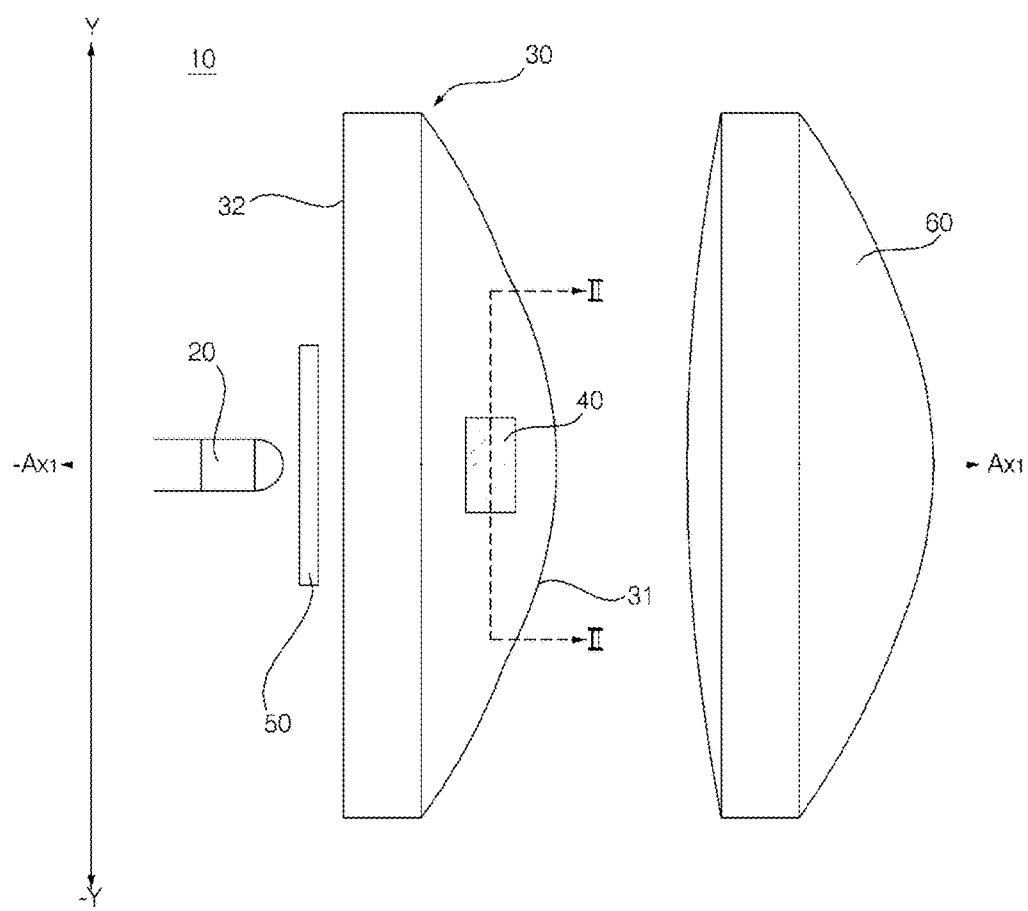
Figure 11:
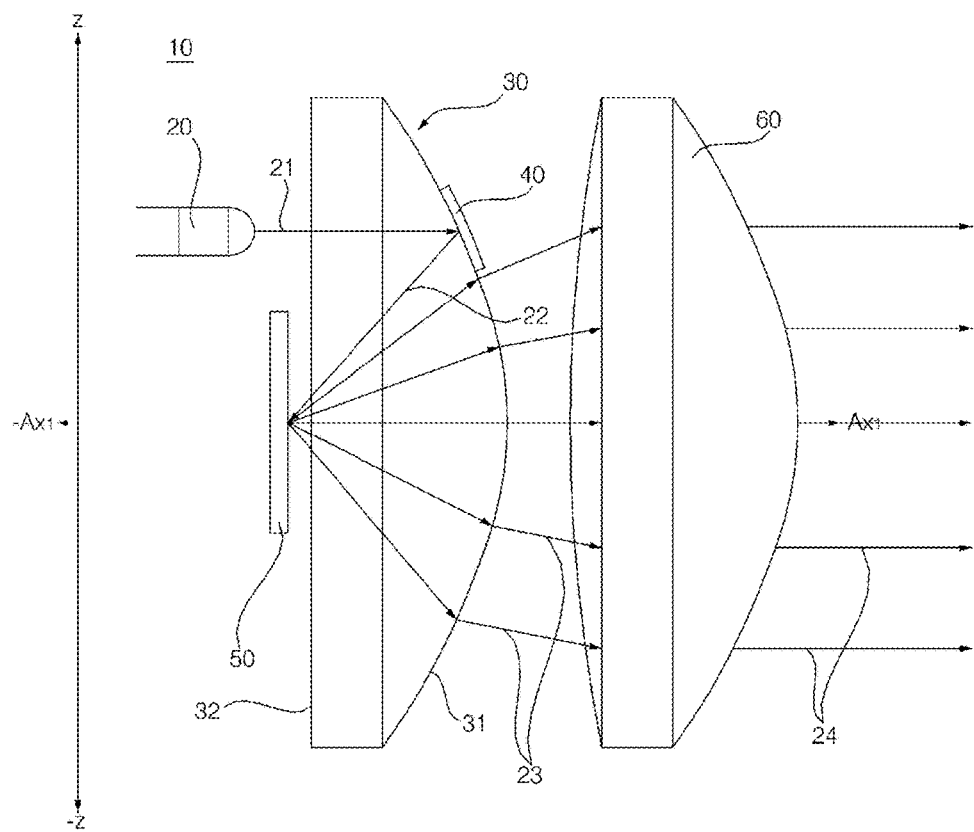
FIG. 11 is a conceptual view illustrating an optical path of the light emitting module according to the embodiment of the present invention.

FIGS. 10A and 10B are conceptual views of a light emitting module according to an embodiment of the present invention when viewed in different directions, and FIG. 11 is a conceptual view illustrating an optical path of the light emitting module according to the embodiment of the present invention.

Referring to FIGS. 10 and 2, a light emitting module 10 according to an embodiment of the present invention includes a condensing lens 30 for condensing incident light into a space, a light source 20 disposed spaced apart from the condensing lens 30 in one direction, a first optical path conversion member 40 disposed spaced apart from the condensing lens 30 in the other direction, and a second optical path conversion member 50 disposed spaced apart from the condensing lens 30 in one direction, the second optical path conversion member 50 being spaced apart from the light source 20.

Specifically, the light emitting module 10 includes a condensing lens 30 for condensing light incident from the rear into a front space, a light source 20 disposed behind the condensing lens 30 to emit first light 21 toward the condensing lens 30, a first optical path conversion member 40 disposed at a front surface 31 of the condensing lens 30 to reflect the first light 21, having passed through the condensing lens 30, and to supply first reflected light 22 to the condensing lens 30, a second optical path conversion member 50 disposed behind the condensing lens 30 to supply the first reflected light 22, having passed through the condensing lens 30, as second reflected light 23 to pass through the condensing lens 30, and an auxiliary condensing lens 60 disposed in front of the condensing lens 30 to condense the second reflected light 23, having passed through the condensing lens 30, in the forward direction.

Here, the direction "front" refers to the right side (direction of Ax1) along a central axis Ax1 and −Ax1 (also referred to as an optical axis) of the condensing lens 30 in FIG. 1. The direction "rear" refers to the left side (direction of −Ax1) along the central axis Ax1 and −Ax1 of the condensing lens 30 in FIG. 1. The vertical direction refers to an upward and downward direction (direction of Z-axis), which is perpendicular to the optical axis in FIG. 10A, and the horizontal direction refers to the direction of the Y-axis in FIG. 10B, which is perpendicular to the optical axis and the vertical direction.

The central axis Ax1 of the condensing lens 30 is an imaginary line which connects the focal point of a front surface 31 of the condensing lens 30 with the center of the condensing lens 30.

The condensing lens 30 functions to concentrate light incident from the rear of the optical axis on a predetermined spot in the front of the optical axis. The condensing lens 30 refracts the incident light due to the shape of the condensing lens 30 and the difference in refractive index between the condensing lens 30 and the outside. The refractive index of the condensing lens 30 may be greater than 1, and preferably, may range from 1.5 to 1.6.

For example, the condensing lens 30 includes a spherical lens or an aspherical lens. Preferably, the condensing lens 30 may be embodied as an aspherical lens.

The condensing lens 30 may have a shape that is convex in the front direction of the optical axis Ax. In another example, the condensing lens 30 may include a rear surface 32 which is perpendicular to the central axis Ax1 of the condensing lens 30, and a front surface 31 which is formed to be convex in the front direction of the condensing lens 30. Alternatively, the rear surface 32 may be formed to be concave in the front direction of the optical axis.

The front surface 31 of the condensing lens 30 is formed in a curve shape having a peak which lies on the central axis Ax1 of the condensing lens 30. In detail, the front surface 31 of the condensing lens 30 may be formed in a curve shape which has a focal point on the central axis Ax1 of the condensing lens 30 and multiple radii of curvature.

The condensing lens 30 refracts light that is incident parallel to the central axis Ax1 of the condensing lens 30, and concentrates the light on a predetermined spot in the front region of the optical axis. The condensing lens 30 may be made of various materials that light can penetrate.

The light source 20 functions to generate light by receiving electrical energy and converting the electrical energy into optical energy. For example, the light source 20 may be embodied as an ultra-high voltage (UHV) mercury lamp, a light emitting diode (LED), a laser diode (LD) or the like. Preferably, the light source 20 may be embodied as a laser diode having good light straightness and convergence.

Various power supplies may supply power to the light source 20. The power may be supplied by a printed circuit board (PCB), a metal core PCB, a flexible PCB, a ceramic PCB or the like.

Here, the laser diode is a semiconductor laser having two electrodes for performing laser processes. For example, the laser diode may have a GaAs, $Al_x Ga_{1-x}As$ double heterojunction structure.

The light source 20 may generate various colors of light. Preferably, the light source 20 generates blue-based light having good efficiency.

The light source 20 is disposed behind the condensing lens 30, and emits the first light 21 toward the condensing lens 30. The first light 21 is incident parallel to the central axis Ax1 (optical axis) of the condensing lens 30. Here, the term "parallel" does not refer to a parallel state in the mathematical sense, but refers to a substantially parallel state within the allowable range.

The first light 21 is incident into the condensing lens 30 through a point on the rear surface 32 of the condensing lens 30 that is located eccentrically from the central axis Ax1 of the condensing lens 30.

In detail, the condensing lens 30 may be divided into a first region and a second region by an imaginary section cut along the central axis Ax1 of the condensing lens 30.

For example, as shown in FIG. 1, the first region is an upper region (region in the direction of Z-axis) above the central axis Ax1 of the condensing lens 30. The second region is a lower region (region in the direction of −Z-axis) below the central axis Ax1 of the condensing lens 30. In this situation, the first light 21 is incident into the first region of the condensing lens 30.

To this end, the light source 20 is located eccentrically from the central axis Ax1 of the condensing lens 30. Specifically, the light source 20 is located eccentrically from the central axis Ax1 of the condensing lens 30 in the vertical direction (the direction of Z-axis and −Z-axis). The light source 20 may be located eccentrically from the central axis Ax1 of the condensing lens 30 in the horizontal direction (the direction of Y-axis and −Y-axis). Alternatively, the light source 20 may be located so as to overlap the central axis Ax1 of the condensing lens 30 when viewed in the vertical direction.

The light source 20 is spaced apart from the central axis Ax1 of the condensing lens 30 in a first direction (direction of Z-axis) which is perpendicular to the central axis Ax1 of the condensing lens 30.

The first light 21 generated from the light source 20 is incident on a point that is eccentric from the central axis Ax1 of the condensing lens 30, and is incident on the first optical path conversion member 40 through the front surface 31 of the condensing lens 30.

The first optical path conversion member 40 is disposed at the front surface 31 of the condensing lens 30, reflects the first light 21 having passed through the condensing lens 30, and supplies the first reflected light 22 to the condensing lens 30.

In detail, the first optical path conversion member 40 is arranged so that the first reflected light 22 can pass through the condensing lens 30 from the front surface 31 to the rear surface 32 thereof. In greater detail, the first optical path conversion member 40 is arranged so that the first reflected light 22 is incident on the first region of the front surface 31 of the condensing lens 30, and is then radiated from the first region of the rear surface 32 of the condensing lens 30.

In addition, the first optical path conversion member 40 may include a planar surface or a curved surface. According to the number of light sources 20, a plurality of first optical path conversion members 40 may be arranged in a stair shape. Further, the first optical path conversion member 40 may be rotatably structured so as to adjust the angle of the first reflected light 22.

A spot S formed as the result of the first reflected light 22 being radiated from the rear surface 32 of the condensing lens 30 is located apart from the central axis Ax1 of the condensing lens 30 in the first direction.

If the first optical path conversion member 40 is disposed on the central axis Ax1 of the condensing lens 30, it has a shortcoming in that the distance between the first optical path conversion member 40 and the light source is increased, and thus the overall length of the light emitting module 10 is increased.

Therefore, the first optical path conversion member 40 is located eccentrically from the central axis Ax1 of the condensing lens 30 in the vertical direction (the direction of Z-axis and −Z-axis). The first optical path conversion member 40 may be located eccentrically from the central axis Ax1 of the condensing lens 30 in the horizontal direction (the direction of Y-axis and −Y-axis). Alternatively, the first optical path conversion member 40 may be located so as to overlap the central axis Ax1 of the condensing lens 30 when viewed in the vertical direction. The first optical path conversion member 40 and the light source 20 may be arranged so as to at least partially overlap each other when viewed from the front of the condensing lens 30.

It is preferable that the first optical path conversion member 40 is disposed at a position spaced apart from the central axis Ax1 of the condensing lens 30 in the first direction (direction of Z-axis) which is perpendicular to the central axis Ax1 of the condensing lens 30.

The first optical path conversion member 40 is mounted at the front surface 31 of the condensing lens 30. Specifically, the first optical path conversion member 40 is disposed so as to contact the front surface 31 of the condensing lens 30.

The first optical path conversion member 40 covers a portion of the front surface 31 of the condensing lens 30. Specifically, the first optical path conversion member 40 covers a portion of the first region of the front surface 31 of the condensing lens 30. The area of the first optical path conversion member 40 may be greater than the sectional area of the first light 21 emitted from the light source 20, and may be less than 10% the area of the front surface 31 of the condensing lens 30.

A light emitting module disclosed in a prior application that was filed by the applicant before filing of the present application has a problem in that the first optical path conversion member 40 is disposed in front of the condensing lens 30 in a state in which the first optical path conversion member 40 is spaced apart from the condensing lens 30, whereby the loss of light occurs when light radiated from the condensing lens 30 passes through the air. In addition, the light emitting module disclosed in the prior application has other problems in that a structure for fixing the first optical path conversion member 40 is needed, and light is blocked by the structure for fixing the first optical path conversion member 40, whereby the loss of light occurs.

The light emitting module according to the present invention is configured such that the first optical path conversion member 40 is disposed at the front surface 31 of the condensing lens 30. As a result, the light emitting module according to the present invention has an advantage in that the size of the light emitting module is reduced. In addition, light radiated from the condensing lens 30 does not pass through the air, whereby the loss of light is reduced. Furthermore, no structure for fixing the first optical path conversion member 40 is needed.

The first optical path conversion member 40 is disposed in contact with the front surface 31 of the condensing lens 30. For example, the first optical path conversion member 40 may be coated on the front surface 31 of the condensing lens 30, or may be inserted into a recess formed in the front surface 31 of the condensing lens 30, which will be described hereinafter.

For example, the first optical path conversion member 40 has a reflection surface intersecting an arbitrary line that is parallel to the optical axis. Here, the first optical path conversion member 40 may be made from a material having a good reflection property, for example, a material selected from the group consisting of Ag, Ni, Al, Rh, Pd, Ir, Ru, Mg, Zn, Pt, Au, Hf, and a combination thereof.

The second optical path conversion member 50 is disposed behind the condensing lens 30, reflects the first reflected light 22 having passed through the condensing lens 30, and supplies the second reflected light 23 to the condensing lens 30.

The second optical path conversion member 50 may function only to reflect the light, or to convert a wavelength of the light while reflecting the light. For example, the second optical path conversion member 50 may convert the wavelength of the blue-based light emitted from the light source 20 and generate white-based light. The detailed structure of the second optical path conversion member 50 will be described later. According to the purpose of the light emitting module 10, the second optical path conversion member 50 may be structured only to reflect the light, or to convert the wavelength of the light during the reflection. Accordingly, the second reflected light 23 reflected from the second optical path conversion member 50 may have a wavelength that is different from that of the first reflected light 22.

The second optical path conversion member 50 is disposed behind the condensing lens 30, and supplies the second reflected light 23 to the condensing lens 30.

The first reflected light 22, which is incident on the front surface 31 of the condensing lens 30 from the first optical path conversion member 40, is refracted at the boundary surfaces of the condensing lens 30, and is radiated from the rear surface 32 of the first region of the condensing lens 30. The first reflected light 22, having passed through the condensing lens 30, is incident on the second optical path conversion member 50, and is reflected as the second reflected light 23 from the second optical path conversion member 50. The second reflected light 23 is incident on the rear surface 32 that is aligned with the central axis Ax1 of the condensing lens 30. The second reflected light 23, which is incident on the condensing lens 30, is refracted at the boundary surfaces of the condensing lens 30, and is radiated to the front through the front surface 31 of the condensing lens 30.

Light emitted from the light source 20 is focused while sequentially passing through the upper half part of the condensing lens 30, the first optical path conversion member 40, the upper half part of the condensing lens 30, the second optical path conversion member 50, and the middle part of the condensing lens 30. The upper half part of the condensing lens 30 is the upper region of the condensing lens 30 on the basis of the central axis Ax1 of the condensing lens 30. The upper half part of the condensing lens 30 is a first region of the condensing lens 30. The lower half part of the condensing lens 30 is the lower region of the condensing lens 30 on the basis of the central axis Ax1 of the condensing lens 30. The lower half part of the condensing lens 30 is a second region of the condensing lens 30. The middle part of the condensing lens 30 is a predetermined region about the central axis Ax1 of the condensing lens 30.

The reflection property of light will now be described as follows.

Light may be specularly reflected or diffusely reflected based on the surface property of the reflector.

Diffuse reflection may include Gaussian reflection, Lambertian reflection, and mixed reflection.

In general, specular reflection is reflection in which, when light is incident on a point of the reflector, an angle between a normal line passing the point and an optical axis of the incident light is equal to an angle between the normal line and an optical axis of reflected light.

Gaussian reflection is reflection in which intensity of reflected light based on an angle at the surface of the reflector and an angle between a normal line and the reflected light vary according to values of a Gaussian function.

Lambertian reflection is reflection in which intensity of reflected light based on an angle at the surface of the reflector and an angle between a normal line and the reflected light vary according to values of a cosine function.

The mixed reflection includes at least one selected from among specular reflection, Gaussian reflection and Lambertian reflection.

In one embodiment, the first optical path conversion member 40 specularly reflects light for light focusing. In the case in which the second optical path conversion member 50 functions only to reflect light, the second optical path conversion member 50 specularly reflects light.

In another embodiment, in the case in which the second optical path conversion member 50 is configured to perform both reflection and wavelength conversion, the second optical path conversion member 50 has a structure including a reflection layer and a phosphor layer coated on the reflection layer. When the second optical path conversion member 50 performs reflection and wavelength conversion, the second reflected light 23 from the second optical path conversion member 50 undergoes Lambertian reflection or mixed reflection. Accordingly, when the second optical path conversion member 50 performs reflection and wavelength conversion, the second reflected light 23 is radiated ahead of the optical axis Ax. In other words, the second reflected light 23 becomes fan-shaped light which is directed at a predetermined angle in upper and lower directions based on an arbitrary line parallel to the central axis Ax1 of the condensing lens 30.

Preferably, the reflection surface of the second optical path conversion member 50 is arranged intersecting or perpendicular to an arbitrary line that is parallel to the central axis Ax1 of the condensing lens 30.

The second reflected light 23 is incident on the rear surface 32 of the condensing lens 30, is refracted at the boundary surfaces of the condensing lens 30, and is radiated from the condensing lens 30. The second reflected light 23 having passed through the condensing lens 30 has a smaller radiation angle than the second reflected light 23 that is incident into the condensing lens 30.

Accordingly, the second reflected light 23 having passed through the condensing lens 30 is diffused while having a certain degree of straightness. Such second reflected light 23 may be used as a low beam in a lamp device for vehicles, which illuminates a region spaced apart by a short distance.

The second optical path conversion member 50 is located on the central axis Ax1 of the condensing lens 30.

The auxiliary condensing lens 60 functions to concentrate light incident from the rear of the optical axis in the forward direction of the optical axis. The auxiliary condensing lens 60 refracts the incident light due to the shape of the auxiliary condensing lens 60 and the difference in refractive index between the auxiliary condensing lens 60 and the outside. The refractive index of the auxiliary condensing lens 60 may be greater than 1, and may preferably range from 1.5 to 1.6.

The central axis of the auxiliary condensing lens 60 overlaps the central axis Ax1 of the condensing lens 30. Specifically, the auxiliary condensing lens 60 is located such that the auxiliary condensing lens 60 overlaps the condensing lens 30 when viewed from the front, The central axis Ax2 of the auxiliary condensing lens 60 is located parallel to the central axis Ax1 of the condensing lens 30.

The light incident into the auxiliary condensing lens 60 from the rear is refracted at the boundary surfaces of the auxiliary condensing lens 60, and is radiated parallel to the optical axis.

The light, whose wavelength is converted and which is reflected from the second optical path conversion member 50, is incident on the rear surface 32 of the condensing lens 30 in a state of being radially spread about the central axis of the condensing lens 30, and is then radiated from the front surface 31 of the condensing lens 30. The emission angle of the light radiated from the front surface 31 of the condensing lens 30 is less than that of the light incident on the rear surface 32 of the condensing lens 30. The light radiated from the front surface 31 of the condensing lens 30 is incident on the auxiliary condensing lens 60, and is therefore efficiently converted into light that is parallel to the optical axis. The auxiliary condensing lens 60 may be made of the same material as the condensing lens 30.

Figure 12:
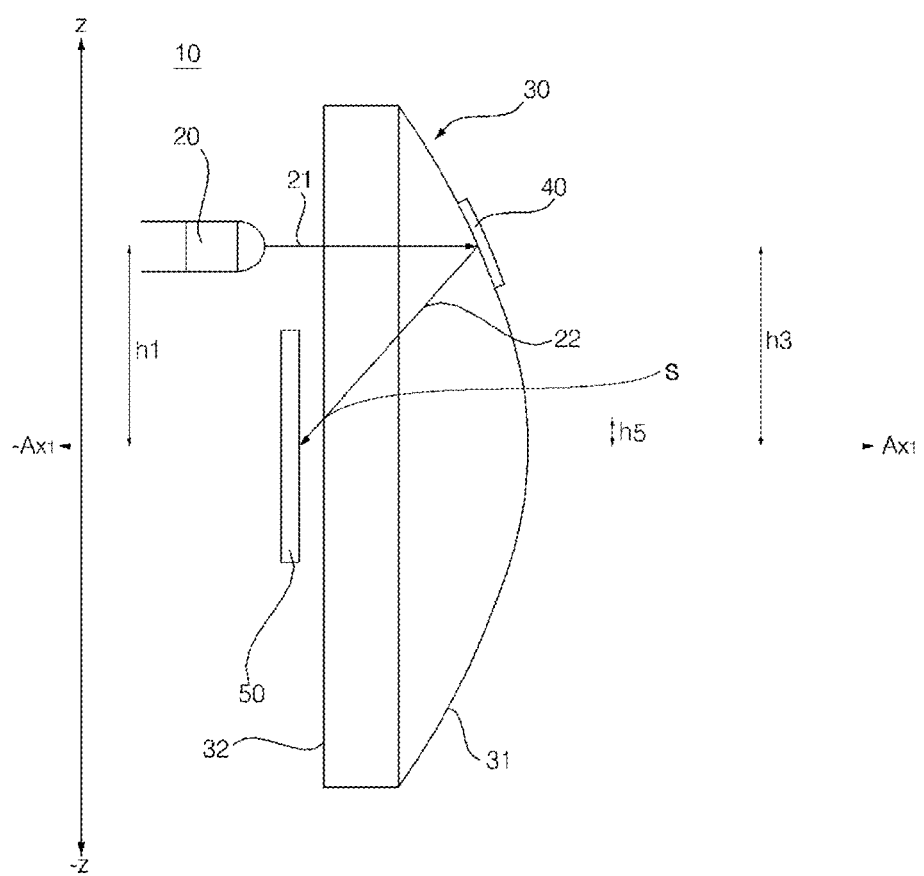
FIG. 12 is a reference view for explaining the position of the light emitting module according to the embodiment of the present invention.

FIG. 12 is a reference view for explaining the position of the light emitting module according to the embodiment of the present invention.

The condensing lens 30 in this embodiment is embodied as an aspherical lens, in which a radius of curvature of a center portion is smaller than that of an edge portion.

When observed from the front of the central axis Ax1 of the condensing lens 30, the light source 20, the first optical path conversion member 40 and the second optical path conversion member 50 are disposed at positions that overlap the condensing lens 30. Therefore, the housing accommodating the light emitting module 10 may be reduced to the size of the condensing lens 30.

In detail, a first distance h1 between the central axis Ax1 of the condensing lens 30 and the light source 20 is smaller than a radius L of the condensing lens 30. Here, the first distance h1 is calculated using the above-mentioned distance calculation formula.

A second distance h2 between the central axis Ax1 of the condensing lens 30 and the second optical path conversion member 50 is 0. The second optical path conversion member 50 is located behind the rear surface 32 of the condensing lens 30 such that the second optical path conversion member 50 is spaced apart from the condensing lens 30 in the rearward direction.

A third distance h3 between the central axis Ax1 of the condensing lens 30 and the first optical path conversion member 40 is greater than 0 and smaller than the radius L of the condensing lens 30. The third distance h3 is also calculated using the above-mentioned distance calculation formula. Preferably, a ratio of the first distance h1 to the third distance h3 may be in the range of 1:0.9 to 1:1.1. More preferably, the first distance h1 and the third distance h3 may be equal to each other.

A fifth distance h5 between the central axis Ax1 of the condensing lens 30 and an exit spot S of the first reflected light 22 may be smaller than the first distance h1 or the second distance h2. Preferably, a ratio of the first distance h1 of the light source 20 to the fifth distance h5 of the exit spot S may be in the range of 1:0.1 to 1:0.6.

For convenience of assembly, the light emitting module 10 is generally accommodated in a hexahedron-shaped housing. By disposing the light source 20 at the upper portion behind the condensing lens 30 and disposing the second optical path conversion member 50 at the middle portion behind the condensing lens 30, the length of the light emitting module 10 may be reduced, and space utilization may be maximized. As a result, the light emitting module 10 may be easily accommodated in the housing.

Further, by disposing the auxiliary condensing lens 60 in front of the condensing lens 30 and disposing the first optical path conversion member 40 at the upper portion in front of the condensing lens 30, the length of the light emitting module 10 may be reduced, and space utilization may be maximized, so that the light emitting module 10 can be easily accommodated in the housing.

Further, by disposing the second optical path conversion member 50 on the central axis Ax1 of the condensing lens 30, light is incident on the condensing lens 30 from the second optical path conversion member 50 along the central axis Ax1 of the condensing lens 30, whereby light efficiency is improved.

Hereinafter, the construction of the first optical path conversion member 40 will be described in detail.

Figure 13A:
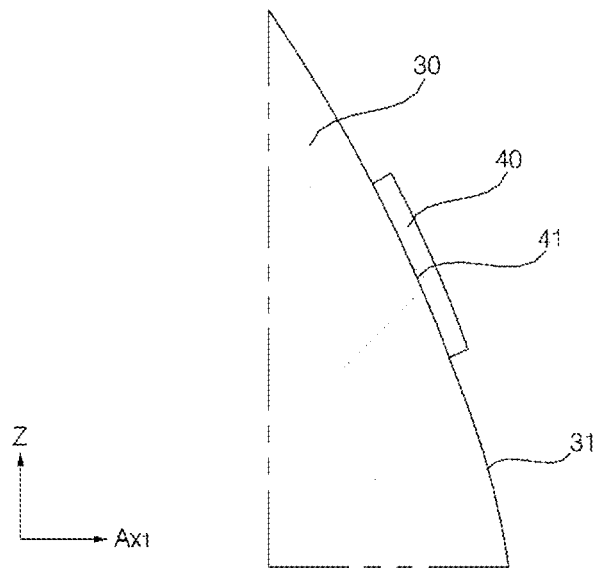
FIG. 13A is a sectional view of a condensing lens taken along line I-I of FIG. 10A.
Figure 13B:
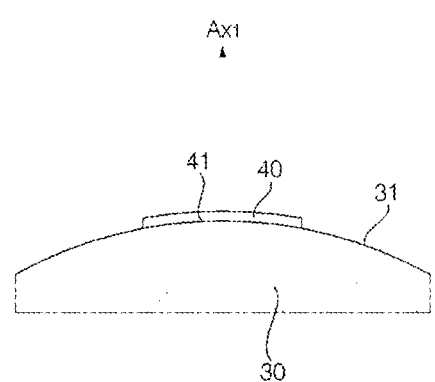
FIG. 13B is a sectional view of the condensing lens taken along line II-II of FIG. 10B.

FIG. 13A is a sectional view of the condensing lens taken along line I-I of FIG. 10A, and FIG. 13B is a sectional view of the condensing lens taken along line II-II of FIG. 10B.

Referring to FIGS. 13A and 13B, the first optical path conversion member 40 has a reflection surface 41 intersecting an arbitrary line that is parallel to the central axis Ax1 of the condensing lens 30. The reflection surface 41 of the first optical path conversion member 40 is in surface contact with the front surface 31 of the condensing lens 30.

The reflection surface 41 of the first optical path conversion member 40 is disposed such that the first reflected light 22, reflected by the reflection surface 41 of the first optical path conversion member 40, is incident on the center portion of the second optical path conversion member 50 through the condensing lens 30. Specifically, the reflection surface 41 of the first optical path conversion member 40 has a spherical shape or a planar shape to condensing light to the second optical path conversion member 50.

In an example, as shown in FIG. 13, the reflection surface 41 of the first optical path conversion member 40 has a shape that contacts the front surface 31 of the condensing lens 30. Specifically, the reflection surface 41 of the first optical path conversion member 40 has a radius of curvature corresponding to that of the front surface 31 of the condensing lens 30.

In another example, the reflection surface 41 of the first optical path conversion member 40 may have a curvature identical to or different from that of the front surface 31 of the condensing lens 30, or may have a planar shape, which will be described hereinafter.

The center of the radius of curvature of the reflection surface 41 of the first optical path conversion member 40 may be located behind the first optical path conversion member 40. Consequently, the reflection surface 41 of the first optical path conversion member 40 may have a spherical shape that is concave in the forward direction. In a case in which the reflection surface 41 of the first optical path conversion member 40 has a spherical shape that is concave in the forward direction, light provided from the first optical path conversion member 40 to the second optical path conversion member 50 is focused on a point.

Figure 14A:
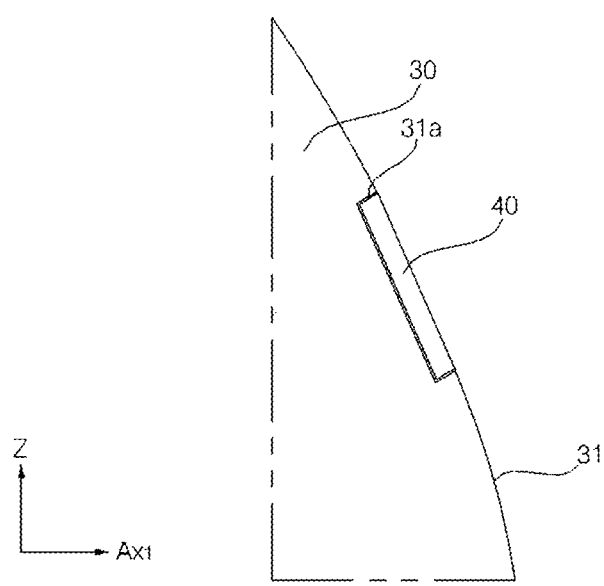
FIG. 14A is a sectional view of a condensing lens and a first optical path conversion member according to another embodiment of the present invention.

FIG. 14A is a sectional view of a condensing lens and a first optical path conversion member according to another embodiment of the present invention.

Referring to FIG. 14A, the light emitting module according to this embodiment is different from the light emitting module according to the embodiment shown in FIG. 13A in that the light emitting module according to this embodiment further includes a receiving recess 31a.

The condensing lens 30 according to this embodiment is provided with a receiving recess 31a for receiving the first optical path conversion member 40.

The receiving recess 31a has a shape and depth corresponding to the shape and thickness of the first optical path conversion member 40. The receiving recess 31a is formed in the front surface 31 of the condensing lens 30 such that the receiving recess 31a is recessed rearward. The depth of the receiving recess 31a corresponds to the thickness of the first optical path conversion member 40.

The bottom surface of the receiving recess 31a is flat, and the reflection surface 41 of the first optical path conversion member 40 contacts the bottom surface of the receiving recess 31a. In another example, the bottom surface of the receiving recess 31a may be curved. The bottom surface of the receiving recess 31a intersects an arbitrary line that is parallel to the central axis Ax1 of the condensing lens 30.

In this embodiment, the receiving recess 31a is formed in the condensing lens 30 to prevent the first optical path conversion member 40 from being separated from the condensing lens 30. Particularly, in a case in which the first optical path conversion member 40 is made of metal, the first optical path conversion member 40 may be heated by light emitted from the light source 20. It is possible to prevent the first optical path conversion member 40 from being separated from the condensing lens 30 by forming the receiving recess 31a in the condensing lens 30.

Figure 14B:
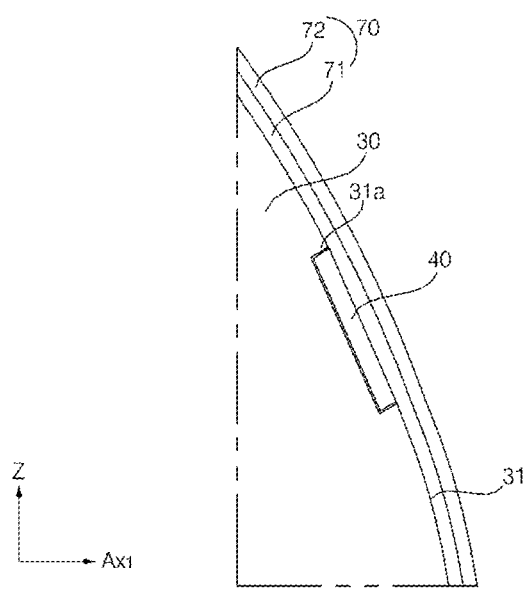
FIG. 14B is a sectional view of a condensing lens and a first optical path conversion member according to another embodiment of the present invention.

FIG. 14B is a sectional view of a condensing lens and a first optical path conversion member according to another embodiment of the present invention.

Referring to FIG. 14B, the light emitting module according to this embodiment is different from the light emitting module according to the embodiment shown in FIG. 14A in that the light emitting module according to this embodiment further includes a coating layer 70.

The coating layer 70 prevents light from being reflected totally at a boundary surface of the condensing lens 30 due to the difference in refractive index between the condensing lens 30 and external air, thereby improving light efficiency and preventing the first optical path conversion member 40 from being separated from the condensing lens 30.

The coating layer 70 covers the front surface 31 of the condensing lens 30 and the first optical path conversion member 40. Specifically, the coating layer 70 is coated on the first optical path conversion member 40 and the front surface 31 of the condensing lens 30.

The coating layer 70 is made of a material that exhibits high adhesiveness and light transmissivity. For example, the coating layer 70 may reduce the difference in refractive index between the condensing lens 30 and external air, thereby maximally preventing light from being reflected totally at the boundary surface of the condensing lens 30.

The refractive index of the coating layer 70 is lower than that of the condensing lens 30 and is higher than 1. Specifically, the coating layer 70 has a refractive index of 1.1 to 1.6.

The coating layer 70 may have a single layer structure or a multiple layer structure. In this embodiment, the coating layer 70 has a multiple layer structure. Specifically, the coating layer 70 has a plurality of refractive layers 71 and 72. The refractive layers 71 and 72 have refractive indices, which gradually increase toward the front surface 31 of the condensing lens 30.

For example, the coating layer 70 may be formed of silicon.

Figure 14C:
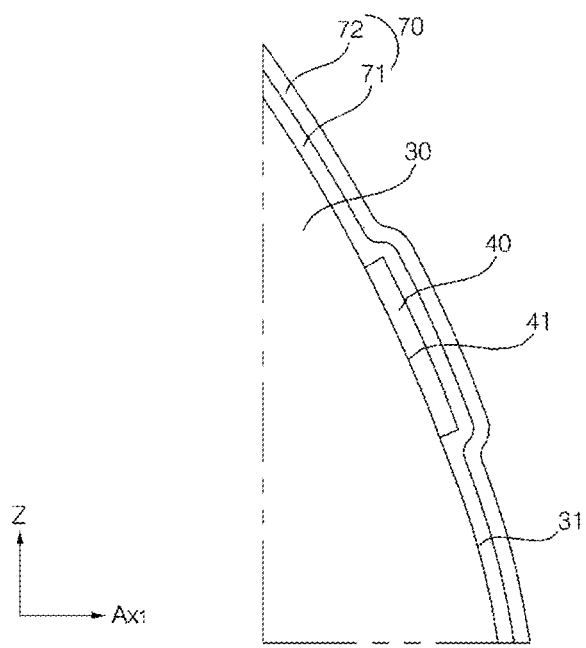
FIG. 14C is a sectional view of a condensing lens and a first optical path conversion member according to another embodiment of the present invention.

FIG. 14C is a sectional view of a condensing lens and a first optical path conversion member according to another embodiment of the present invention.

Referring to FIG. 14C, the light emitting module according to this embodiment is different from the light emitting module according to the embodiment shown in FIG. 13A in that the light emitting module according to this embodiment further includes a coating layer 70.

The first optical path conversion member 40 is disposed on the front surface 31 of the condensing lens 30 such that the first optical path conversion member 40 protrudes from the front surface 31 of the condensing lens 30, and the coating layer 70 covers both the front surface 31 of the condensing lens 30 and the first optical path conversion member 40.

The coating layer 70 has the same construction as described with reference to FIG. 14B.

Figure 14D:
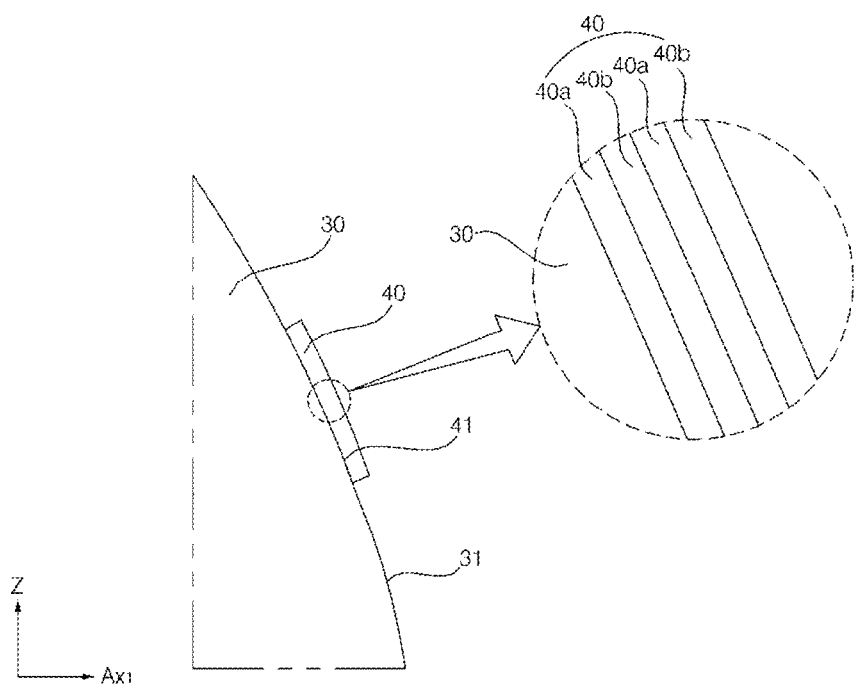
FIG. 14D is a sectional view of a condensing lens and a first optical path conversion member according to a further embodiment of the present invention.

FIG. 14D is a sectional view of a condensing lens and a first optical path conversion member according to a further embodiment of the present invention.

Referring to FIG. 14D, the light emitting module according to this embodiment is different from the light emitting module according to the embodiment shown in FIG. 13A in that the first optical path conversion member 40 of this embodiment is different in structure from the first optical path conversion member 40 of the embodiment shown in FIG. 13A.

In a case in which the first optical path conversion member 40 is made of a metal material that exhibits high reflectivity, it is difficult for the first optical path conversion member 40 to be securely attached to the condensing lens 30, with the result that the first optical path conversion member 40 may be easily separated from the condensing lens 30 when the first optical path conversion member 40 is heated.

In this embodiment, therefore, the first optical path conversion member 40 has a structure that converts the path of incident light using a dielectric.

For example, the first optical path conversion member 40 may include a plurality of dielectric layers 40a and 40b having different refractive indices.

For example, the first optical path conversion member 40 may include at least one first dielectric layer 40a having a first refractive index and at least one second dielectric layer 40b having a second refractive index, which is different from the first refractive index.

That is, the first optical path conversion member 40 may be configured to have a structure in which dielectric layers 40a and 40b having different refractive indices are alternately stacked.

In an example, each first dielectric layer 40a may be a low refractive index layer, and each second dielectric layer 40b may be a high refractive index layer. However, the present invention is not limited thereto.

The first optical path conversion member 40 may be configured to have a two-layered to thirty-layered structure. In this case, the first dielectric layer 40a and the second dielectric layer 40b may each have a two-layered to ten-layered structure. If the first optical path conversion member 40 is configured to have a structure including less than two layers, it is not possible to obtain sufficient reflectance based on total reflection. If the first optical path conversion member 40 is configured to have a structure including more than thirty layers, the manufacturing cost of the first optical path conversion member 40 is increased. The first optical path conversion member 40 may have a thickness of 50 nm to 5 µm.

Meanwhile, on the assumption that the wavelength of light generated by the light source 20 is $\lambda$, the refractive index of a medium is n, and an odd number is m, first dielectric layers 40a, each of which is a low refractive index layer, and second dielectric layers 40b, each of which is a high refractive index layer, may be alternately stacked such that the first optical path conversion member 40 has a thickness of $m\lambda/4n$. In this case, it is possible to obtain a reflectance of 95% of more from light having a specific wavelength band $\lambda$.

Consequently, the first dielectric layer 40a, which is a low refractive index layer, and the second dielectric layer 40b, which is a high refractive index layer, may each have a thickness equivalent to $\lambda/4$ of a reference wavelength. At this time, the dielectric layers 40a and 40b may each have a thickness of 2 Å to 10 um.

In addition, each layer constituting the first optical path conversion member 40 may include a dielectric. For example, the first optical path conversion member 40 may be composed of $M_xO_y$ (M: metal, O: oxide, and X and Y: constants).

The first optical path conversion member 40 may include one selected from among silicon dioxide ($SiO_2$), titanium dioxide ($TiO_2$), and tantalum oxide ($Ta_2O_5$).

In an example, the first dielectric layer 40a, which is a low refractive index layer, may be made of silicon dioxide ($SiO_2$) having a refractive index of 1.4, and the second dielectric layer 40b, which is a high refractive index layer, may be made of titanium dioxide ($TiO_2$) or tantalum oxide ($Ta_2O_5$) having a refractive index of 2.7. However, the present invention is not limited thereto.

In particular, the first dielectric layer 40a and the second dielectric layer 40b may totally reflect at least 95% of light having a wavelength band of 600 nm to 870 nm to improve reflectance in a section of the metal reflection layer in which reflectance is reduced.

In an example, in a case in which the first dielectric layer 40a is made of silicon dioxide ($SiO_2$), the first dielectric layer 40a may have a thickness of 107 nm to 155 nm in order to totally reflect light having a wavelength band of 600 nm to 870 nm. In addition, in a case in which the second dielectric layer 40b is made of titanium dioxide ($TiO_2$), the second dielectric layer 40b may have a thickness of 55.5 nm to 80.6 nm in order to totally reflect light having a wavelength band of 600 nm to 870 nm.

In a case in which the first optical path conversion member 40 includes dielectric layers having different refractive indices, adhesion between the front surface 31 of the condensing lens 30 and the first optical path conversion member 40 is improved. In addition, the first optical path conversion member 40 is prevented from being easily separated from the front surface 31 of the condensing lens 30 due to heat.

Figure 15:
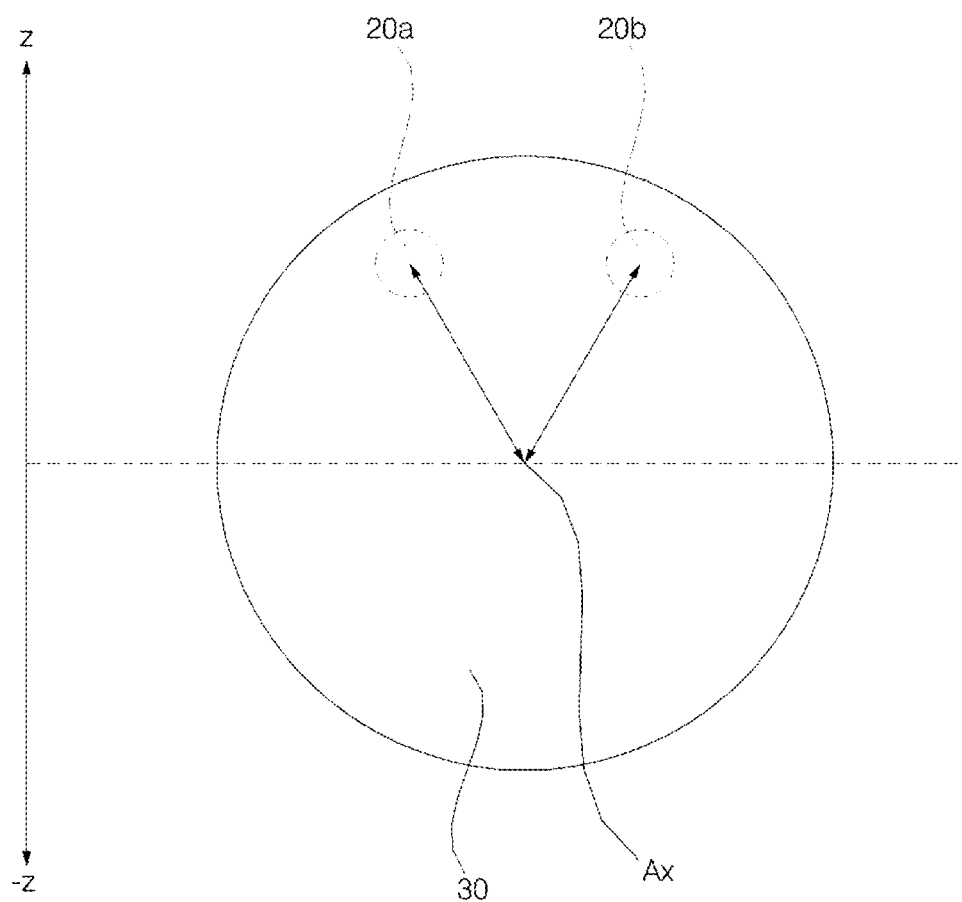
FIG. 15 is a conceptual view of a light emitting module according to another embodiment of the present invention.

FIG. 15 is a conceptual view of a light emitting module according to another embodiment of the present invention.

Referring to FIG. 15, the number of light sources 20 in the light emitting module 10 according to this embodiment is different from that in the light emitting module of the previous embodiment, shown in FIG. 1.

FIG. 15 is a view of the light emitting module when viewed from the front of the optical axis. The light emitting module according to this embodiment may include a plurality of light sources 20.

The light sources 20a and 20b are arranged in the first region of the condensing lens 30, and the distances (first distance h1) between the central axis Ax1 of the condensing lens 30 and the respective light sources 20a and 20b are equal. Therefore, when viewed from the front of the optical axis, the light sources 20a and 20b are arranged on a circular arc at the first distance h1 from the central axis Ax1 of the condensing lens 30 within the first region of the condensing lens 30. The minimum interval between the light sources 20a and 20b is set in consideration of heat dissipation.

Figure 16:
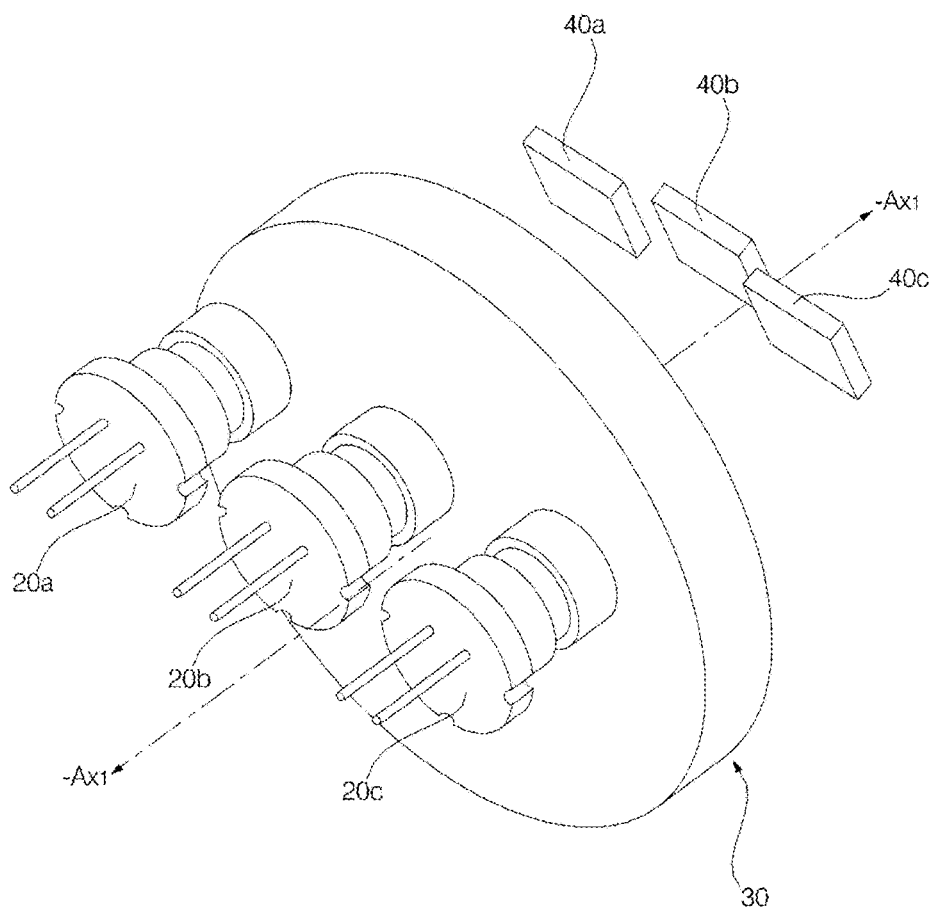
FIG. 16 is a conceptual view of a light emitting module according to another embodiment of the present invention.

FIG. 16 is a conceptual view of a light emitting module according to another embodiment of the present invention.

Referring to FIG. 16, the number of light sources 20 and first optical path conversion members 40 in the light emitting module 10 according to this embodiment is different from those in the light emitting module of the previous embodiment, shown in FIG. 1.

The light emitting module according to this embodiment may include a plurality of light sources 20 and a plurality of first optical path conversion members 40.

The light sources 20a, 20b, and 20C are arranged in the first region of the condensing lens 30, and the distances (first distance h1) between the central axis Ax1 of the condensing lens 30 and the respective light sources 20a, 20b, and 20C are equal. Therefore, when viewed from the front of the optical axis, the light sources 20a, 20b, and 20C are arranged on a circular arc at the first distance h1 from the central axis Ax1 of the condensing lens 30 within the first region of the condensing lens 30. The minimum interval among the light sources 20a, 20b, and 20C is set in consideration of heat dissipation.

The first optical path conversion members 40a, 40b, and 40C are arranged in the first region of the condensing lens 30. Light beams, generated by the light sources 20a, 20b, and 20C, pass through the condensing lens 30, and are then incident on the first optical path conversion members 40a, 40b, and 40C. The number of the first optical path conversion members 40a, 40b, and 40C corresponds to that of the light sources 20a, 20b, and 20C. The first optical path conversion members 40a, 40b, and 40C may individually adjust reflected angles of the light beams incident from the light sources 20a, 20b, and 20C such that the light beams radiated to the second optical path conversion member 50 is concentrated on a single spot.

Figure 17:
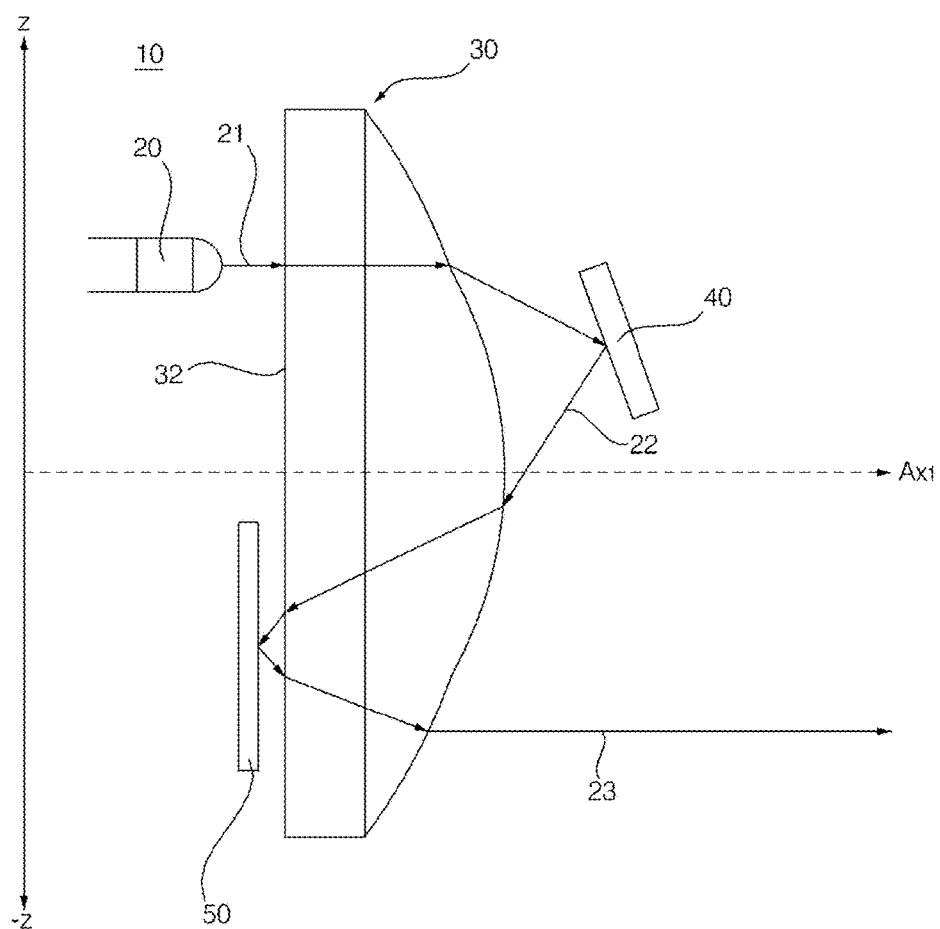
FIG. 17 is a conceptual view of a light emitting module according to a further embodiment of the present invention.

FIG. 17 is a conceptual view of a light emitting module according to a further embodiment of the present invention.

Referring to FIG. 17, the light emitting module 10 according to this embodiment is different from that the light emitting module of the previous embodiment, shown in FIG. 1, in that the second optical path conversion member 50 reflects incident light, but does not convert the wavelength of the incident light. That is, the second optical path conversion member 50 does not include a wavelength conversion layer 52.

First reflected light 22, incident on the second optical path conversion member 50, is specularly reflected by the second optical path conversion member 50. Second reflected light 23, radiated from the second optical path conversion member 50, passes through the condensing lens 30, and is concentrated in the front.

Figure 18:
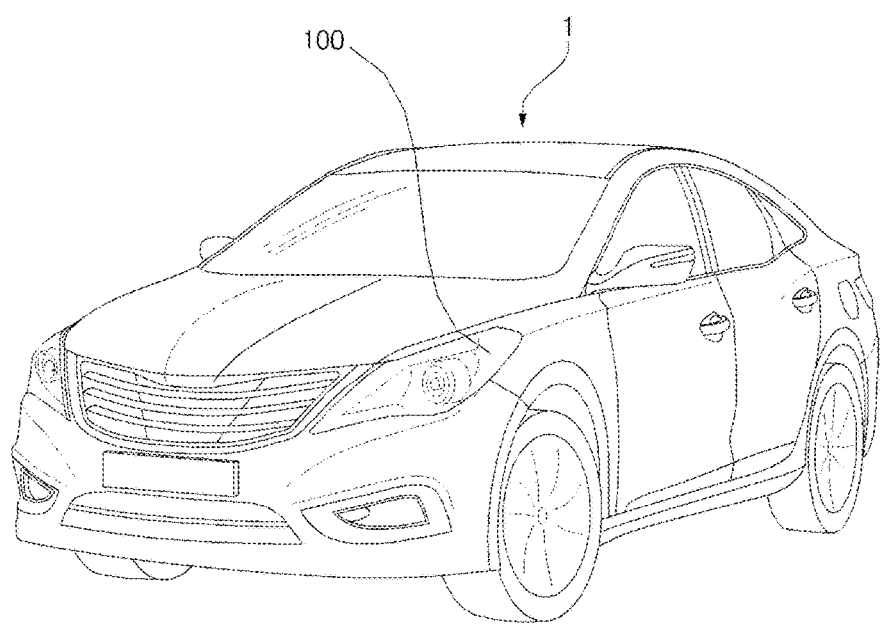
FIG. 18 is a view illustrating a car equipped with the light emitting module according to the present invention.
Figure 19:
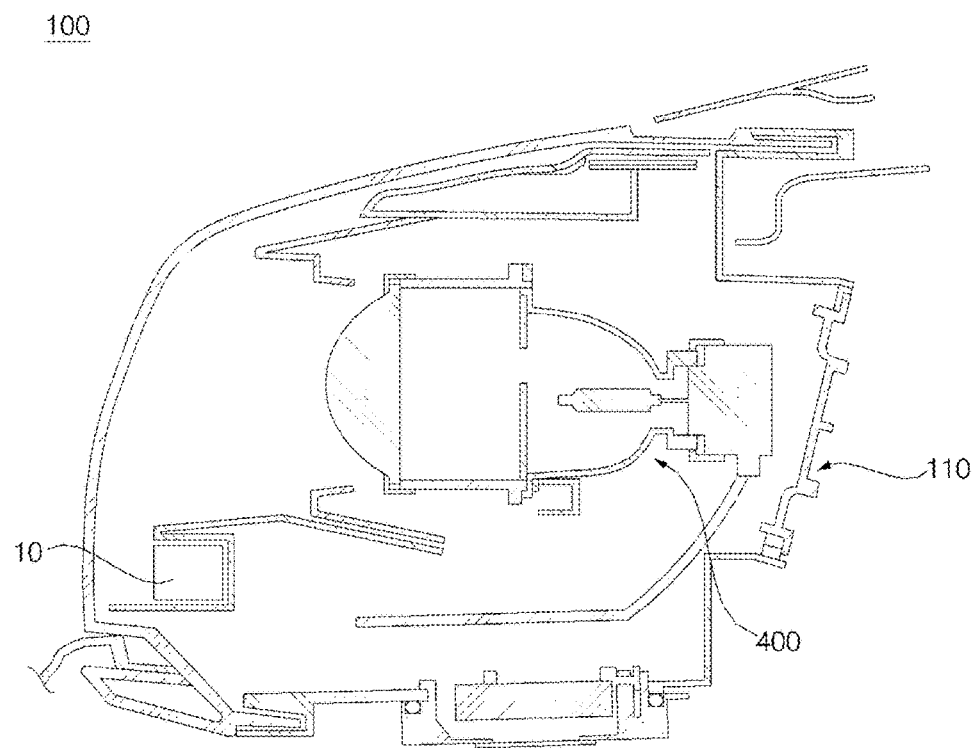
FIG. 19 is a sectional view illustrating a lamp device for vehicles including the light emitting module according to the present invention.
Figure 20:
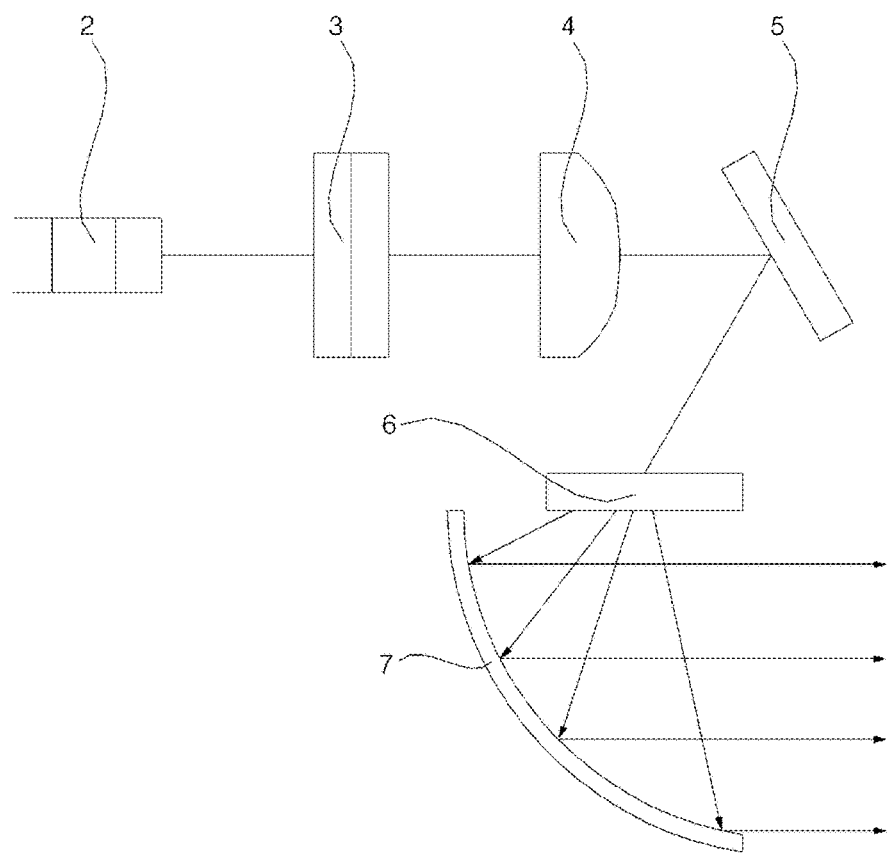
FIG. 20 is a conceptual view of a conventional light emitting module.

FIG. 18 is a view illustrating a car equipped with the light emitting module 10 according to the present invention, and FIG. 19 is a sectional view illustrating a lamp device for vehicles including the light emitting module 10 according to the present invention.

Referring to FIG. 18, the light emitting module 10 according to the embodiment is mounted to the front portion of a vehicle 1. The light emitting module 10 may be accommodated in an automotive lamp device 100, and the automotive lamp device 100 may be mounted to the front portion of the vehicle 1. In this embodiment, the automotive lamp device 100 includes a head lamp for illuminating the area ahead while driving at night, a fog lamp, a turn signal lamp and so on.

In another embodiment, the automotive lamp device may be mounted to the rear portion of the vehicle 1 so as to function as a tail lamp.

Referring to FIG. 19, the automotive lamp device 100 according to the embodiment of the present invention comprises the lamp housing 110 and the light emitting module 10 accommodated in the lamp housing 110.

According to embodiments, the automotive lamp device 100 may further comprise a light source unit 400.

The lamp housing 110 provides a space in which the light emitting module 10 and/or the light source unit 400 are disposed.

The light source unit 400 functions to output light which is necessary for vehicle driving.

Here, the light emitting module 10 and the light source unit 400 may emit the same type of light. Preferably, the light emitted from the light emitting module 10 may have a different color from that emitted from the light source unit 400, or one thereof may be plane light and the other may be point light.

The light emitted from the light source unit 400 has good diffusivity and may be used to illuminate a region spaced apart by a short distance. The light emitted from the light emitting module 10 has good straightness and may be used to illuminate a small region spaced apart by a long distance.

The light emitting module 10 may use a laser diode, and the light source unit 400 may use a xenon lamp.

Figure 21:
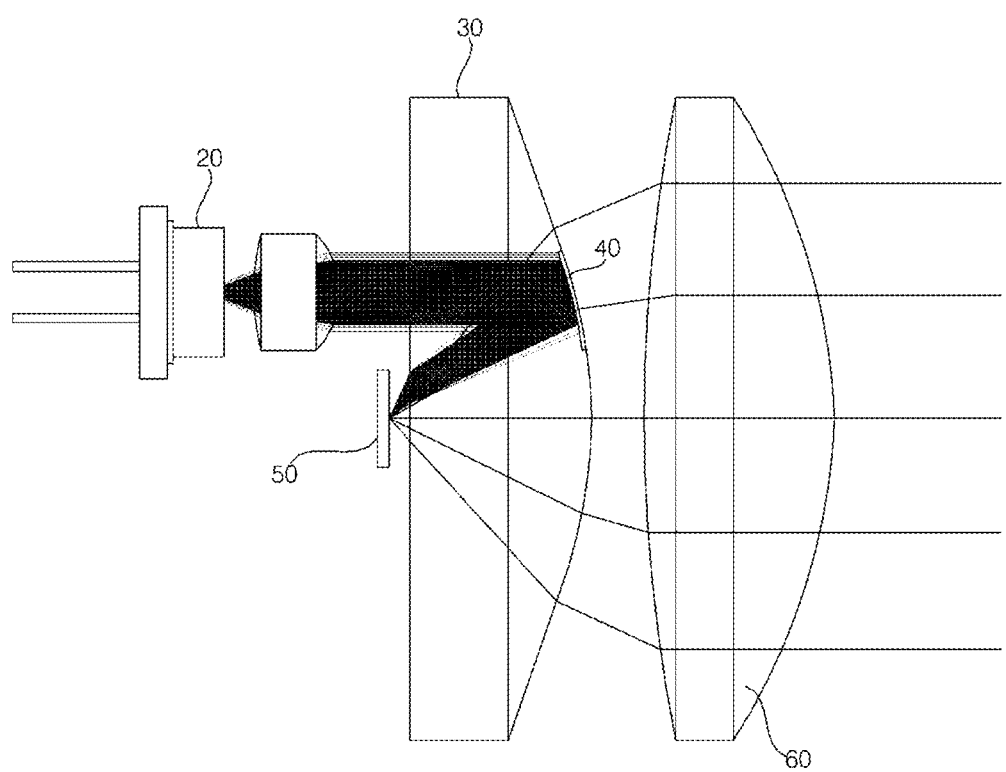
FIG. 21 is a view illustrating an optical path of the light emitting module according to the present invention

FIG. 21 is a view illustrating an optical path of the light emitting module according to the present invention.

Referring to FIG. 21, the first light 21 generated from the light source 20 is incident into the upper region (first region) of the condensing lens 30, is refracted, and is radiated from the condensing lens 30. The first light 21 radiated from the condensing lens 30 is incident on the first optical path conversion member 40.

The first light 21 incident on the first optical path conversion member 40 is reflected therefrom, and is radiated as the first reflected light 22. The first reflected light 22 is incident on the upper region (second region) of the condensing lens 30. The first reflected light 22 is radiated rearward through the upper region of the condensing lens 30.

The first reflected light 22 radiated from the condensing lens 30 is incident on the second optical path conversion member 50. The first reflected light 22 is converted into white light at the second optical path conversion member 50 by wavelength conversion, is reflected from the second optical path conversion member 50, and is radiated as the second reflected light 23.

At this time, since the second reflected light 23 undergoes Lambertian reflection, the second reflected light 23 becomes fan-shaped light which is directed at a predetermined emission angle based on an arbitrary line parallel to the optical axis.

The second reflected light 23 is incident on the middle part of the condensing lens 30, is refracted, and is radiated ahead of the condensing lens 30.

The second reflected light 23 radiated from the condensing lens 30 is concentrated by the auxiliary condensing lens 60, and is radiated as the second light 24.

The majority of the second reflected light 23 is incident into the auxiliary condensing lens 60, and is refracted to be parallel light.

According to embodiments, by disposing the light source at the upper portion behind the condensing lens and disposing the second optical path conversion member at the lower portion behind the condensing lens, the length of the light emitting module may be reduced, and space utilization may be maximized. As a result, the light emitting module may be easily accommodated in the housing.

Further, by disposing the auxiliary condensing lens at the lower portion in front of the condensing lens and disposing the first optical path conversion member at the upper portion in front of the condensing lens, the length of the light emitting module may be reduced, and space utilization may be maximized. As a result, the light emitting module may be easily accommodated in the housing.

Further, since the condensing lens is divided into the upper and lower regions, and light passes through the condensing lens several times, the number of components constituting the light emitting module may be decreased and the manufacturing cost of the light emitting module may be reduced.

Further, by respectively disposing the light source, from which heat is generated, and the second optical path conversion member in the upper region and the lower region of the condensing lens such that the light source and the second optical path conversion member are spaced apart from each other, thermal concentration of the light emitting module may be maximally prevented.

Further, since heat is discharged through the large surface of the second optical path conversion member, which converts the wavelength of light, thermal concentration on the phosphor, which converts the wavelength of light, may be maximally prevented, and the reduction in conversion efficiency as the result of the phosphor being heated may be maximally prevented.

Further, since the light emitting module has a structure that is capable of maximally preventing thermal concentration on the phosphor, a laser diode light source having high output may be used, and the output of the light emitting module may be increased.

Further, by using the reflective phosphor, the optical efficiency may be enhanced.

Further, the light emitting module may emit light having good light convergence and straightness through a simple structure using a laser light source.

Further, off-axis aberration may be compensated for.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A light emitting module comprising:
a lens;
a laser diode configured to provide first light that passes through the lens;
a first optical path conversion member configured to reflect the first light and provide first reflected light that passes through the lens; and
a second optical path conversion member configured to provide the first reflected light as second reflected light that passes to pass through the lens,
wherein the second optical path conversion member includes a phosphor layer configured to convert a wavelength of incident light and a reflection layer configured to provide the first reflected light as the second reflected light that passes through the lens, and
wherein the laser diode is positioned so as to be decentered with respect to a central axis of the lens; and
wherein the laser diode and the second optical path conversion member are arranged so as to be opposite each other with respect to the central axis of the lens.

2. The light emitting module according to claim 1, wherein the first optical path conversion member is positioned so as to be decentered with respect to the central axis of the lens.

3. The light emitting module according to claim 2, wherein an optical axis of the second optical path conversion member is positioned so as to be decentered with respect to the central axis of the lens.

4. The light emitting module according to claim 2, wherein a first distance between the central axis of the lens and the laser diode is less than a radius of the lens.

5. The light emitting module according to claim 2, wherein a second distance between the central axis of the lens and the first optical path conversion member is less than a radius of the lens.

6. The light emitting module according to claim 3, wherein a third distance between the central axis of the lens and the second optical path conversion member is less than a radius of the lens.

7. The light emitting module according to claim 1, wherein the laser diode, the second optical path conversion member, the lens, and the first optical path conversion member are arranged in a straight line in order when viewed from above.

8. The light emitting module according to claim 1, further comprising an auxiliary condensing lens configured to condense the second reflected light having passed through the lens.

9. The light emitting module according to claim 8, wherein the auxiliary condensing lens is positioned so as to be decentered with respect to a central axis of the lens.

10. The light emitting module according to claim 8, wherein the auxiliary condensing lens comprises:
a first refractive surface exposed toward the lens; and
a second refractive surface opposite the first refractive surface,
the first refractive surface and the second refractive surface having different shapes.

11. The light emitting module according to claim 10, wherein
a vertical refractive section of the auxiliary condensing lens is different from a horizontal refractive section of the auxiliary condensing lens.

12. The light emitting module according to claim 11, wherein the vertical refractive section has a smaller radius of curvature than the horizontal refractive section.

13. The light emitting module according to claim 11, wherein the horizontal refractive section is flat, and the vertical refractive section is curved.

14. The light emitting module according to claim 1, wherein the second optical path conversion member is positioned on a central axis of the lens.

15. The light emitting module according to claim 14, further comprising an auxiliary condensing lens configured to condense the second reflected light having passed through the lens.

16. The light emitting module according to claim 15, wherein an optical axis of the auxiliary condensing lens is aligned with the central axis of the lens.

17. The light emitting module according to claim 1, wherein the first optical path conversion member is disposed on a first surface of the lens.

18. The light emitting module according to claim 17, wherein the first optical path conversion member covers a portion of the front surface of the lens.

19. The light emitting module according to claim 17, wherein the lens is provided with a receiving recess configured to receive the first optical path conversion member.

20. A headlight comprising:
a housing; and
a light-emitting module provided in the housing,
wherein the light-emitting module includes:
a lens;
a laser diode configured to provide first light that passes through the lens;
a first optical path conversion member configured to reflect the first light and provide first reflected light that passes through the lens; and
a second optical path conversion member configured to provide the first reflected light as second reflected light that passes to pass through the lens,
wherein the second optical path conversion member includes a phosphor layer configured to convert a wavelength of incident light and a reflection layer configured to provide the first reflected light as the second reflected light that passes through the lens, and
wherein the laser diode is positioned so as to be decentered with respect to a central axis of the lens; and
wherein the laser diode and the second optical path conversion member are arranged so as to be opposite each other with respect to the central axis of the lens.

21. A vehicle comprising:
a body; and
a headlight provided at the body,
wherein the headlight includes:
a housing; and
a light-emitting module provided in the housing, the light-emitting module including:
a lens;
a laser diode configured to provide first light that passes through the lens;
a first optical path conversion member configured to reflect the first light and provide first reflected light that passes through the lens; and a second optical path conversion member configured to provide the first reflected light as second reflected light that passes to pass through the lens,
wherein the second optical path conversion member includes a phosphor layer configured to convert a wavelength of incident light and a reflection layer configured to provide the first reflected light as the second reflected light that passes through the lens, and
wherein the laser diode is positioned so as to be decentered with respect to a central axis of the lens; and wherein the laser diode and the second optical path conversion member are arranged so as to be opposite each other with respect to the central axis of the lens.

22. A light-emitting module comprising:
a lens;
a light source disposed at a first side of the lens to emit light into the lens;
a first reflector that is disposed at a second side of the lens and that is configured to (i) change a path of the light having made a first pass through the lens and (ii) supply the light back to the lens; and
a second reflector that is disposed at the first side of the lens and that is configured to (i) change a path of the light having made a second pass through the lens and (ii) supply the light to the lens,
wherein the first reflector is positioned so as to be decentered with respect to the central axis of the lens; and wherein the light source and the second reflector are arranged so as to be opposite each other with respect to the central axis of the lens.

23. The light-emitting module of claim 22, wherein the lens is lens configured to concentrate incident light into a first spot.

24. The light-emitting module of claim 20, wherein the laser diode is spaced apart from the central axis of the lens in a first direction which is perpendicular to the central axis of the lens.

25. The light-emitting module of claim 8, wherein the auxiliary condensing lens converts the second reflected light into a high beam.

26. The light-emitting module of claim 22, wherein the light source is a laser diode.

27. The light-emitting module of claim 22, wherein the laser diode, the second optical path conversion member, the lens, and the first optical path conversion member are arranged in a straight line in order when viewed from above.

28. The light-emitting module of claim 22, wherein the second reflector includes:
a wavelength changing member configured to convert a wavelength of the light; and
a reflection layer configured to reflect the incident light.

29. The light-emitting module of claim 22, wherein a first distance between an optical axis of the lens and the light source is less than a radius of the lens,
wherein a second distance between the optical axis of the lens and the first reflector is less than a radius of the lens, and
wherein a third distance between the optical axis of the lens and the second reflector is less than a radius of the lens.

30. The light-emitting module of claim 22, further comprising:
an auxiliary lens configured to concentrate incoming light into a first spot.

31. The light-emitting module of claim 22, further comprising:
a plurality of light sources configured to emit light into the lens.

32. The light-emitting module of claim 22, wherein the light source is spaced apart from the central axis of the lens in a first direction which is perpendicular to the central axis of the lens.

33. A headlight comprising:
a housing; and
a light-emitting module provided in the housing, the light-emitting module including:
a lens,
a light source disposed at a first side of the lens to emit light into the lens,
a first reflector that is disposed at a second side of the lens and that is configured to (i) change a path of the light having made a first pass through the lens and (ii) supply the light back to the lens, and
a second reflector that is disposed at the first side of the lens and that is configured to (i) change a path of the light having made a second pass through the lens and (ii) supply the light to the lens,
wherein the first reflector is positioned so as to be decentered with respect to the central axis of the lens; and wherein the light source and the second reflector are arranged so as to be opposite each other with respect to the central axis of the lens.

34. A vehicle comprising:
a body; and
a headlight provided at the body, the headlight including
a housing; and
a light-emitting module provided in the housing, the light-emitting module including:
a lens,
a light source disposed at a first side of the lens to emit light into the lens,
a first reflector that is disposed at a second side of the lens and that is configured to (i) change a path of the light having made a first pass through the lens and (ii) supply the light back to the lens, and
a second reflector that is disposed at the first side of the lens and that is configured to (i) change a path of the light having made a second pass through the lens and (ii) supply the light to the lens,
wherein the first reflector is positioned so as to be decentered with respect to the central axis of the lens; and wherein the light source and the second reflector are arranged so as to be opposite each other with respect to the central axis of the lens.

35. A light-emitting module comprising:
a lens;
a laser diode configured to provide first light that passes through the lens
a first reflector configured to provide first reflected light that passes through the lens;
a second reflector configured to provide the first reflected light as second reflected light that passes to pass through the lens,
wherein the laser diode and the first reflector are positioned so as to be decentered with respect to a central axis of the lens; and wherein the laser diode and the second reflector are arranged so as to be opposite each other with respect to the central axis of the lens.

36. A headlight comprising:
a housing; and
a light-emitting module provided in the housing, the light-emitting module comprising:
a lens;

a laser diode configured to provide first light that passes through the lens
a first reflector configured to provide first reflected light that passes through the lens; and
a second reflector configured to provide the first reflected light as second reflected light that passes to pass through the lens,
wherein the laser diode and the first reflector are positioned so as to be decentered with respect to a central axis of the lens; and wherein the laser diode and the second reflector are arranged so as to be opposite each other with respect to the central axis of the lens.

37. A vehicle comprising:
a body; and
a headlight provided at the body, the headlight including:
  a housing; and
  a light-emitting module provided in the housing, the light-emitting module comprising:
    a lens;
    a laser diode configured to provide first light that passes through the lens
    a first reflector configured to provide first reflected light that passes through the lens; and
    a second reflector configured to provide the first reflected light as second reflected light that passes to pass through the lens,
  wherein the laser diode and the first reflector are positioned so as to be decentered with respect to a central axis of the lens; and wherein the laser diode and the second reflector are arranged so as to be opposite each other with respect to the central axis of the lens.

* * * * *